US008313885B2

(12) United States Patent
Loccufier et al.

(10) Patent No.: US 8,313,885 B2
(45) Date of Patent: Nov. 20, 2012

(54) LITHOGRAPHIC PRINTING PLATE PRECURSOR COMPRISING BI-FUNCTIONAL COMPOUNDS

(75) Inventors: Johan Loccufier, Zwijnaarde (BE); Hieronymus Andriessen, Beerse (BE)

(73) Assignee: AGFA Graphics NV, Mortsel (BE)

(*) Notice: Subject to any disclaimer, the term of this patent is extended or adjusted under 35 U.S.C. 154(b) by 301 days.

(21) Appl. No.: 11/546,830

(22) Filed: Oct. 12, 2006

(65) Prior Publication Data

US 2007/0105041 A1 May 10, 2007

Related U.S. Application Data

(60) Provisional application No. 60/737,106, filed on Nov. 16, 2005.

(30) Foreign Application Priority Data

Nov. 10, 2005 (EP) .................................... 05110568

(51) Int. Cl.
*G03F 7/00* (2006.01)
*G03F 7/26* (2006.01)

(52) U.S. Cl. .................. 430/270.1; 430/281.1; 430/302; 101/450.1; 101/453; 101/463.1

(58) Field of Classification Search ............... 430/270.1, 430/302
See application file for complete search history.

(56) References Cited

U.S. PATENT DOCUMENTS

| | | | | |
|---|---|---|---|---|
| 3,761,544 | A | 9/1973 | Herweh | |
| 4,045,232 | A | 8/1977 | Parkinson | |
| 4,458,005 | A | 7/1984 | Mohr et al. | |
| 4,840,713 | A | 6/1989 | Pliefke | |
| 4,897,168 | A | 1/1990 | Boergerding et al. | |
| 4,963,463 | A | 10/1990 | Koshiba et al. | |
| 4,981,517 | A | 1/1991 | Desanto et al. | |
| 5,156,723 | A | 10/1992 | Pliefke et al. | |
| 5,314,787 | A | 5/1994 | Elsaesser et al. | |
| 5,556,531 | A | 9/1996 | Wiedemann | |
| 5,637,441 | A | 6/1997 | Brenk et al. | |
| 5,922,512 | A | 7/1999 | DoMinh | |
| 6,140,392 | A | 10/2000 | Kingman et al. | |
| 6,852,469 | B2 * | 2/2005 | Endo | 430/272.1 |
| 2002/0006575 | A1 | 1/2002 | Gaschler | |
| 2002/0112630 | A1 * | 8/2002 | Verschueren et al. | 101/450.1 |
| 2002/0136988 | A1 * | 9/2002 | Van Damme et al. | 430/302 |
| 2002/0142245 | A1 | 10/2002 | Zheng | |
| 2002/0142247 | A1 | 10/2002 | Kawamura et al. | |
| 2005/0106501 | A1 * | 5/2005 | Van Aert et al. | 430/270.1 |
| 2006/0019191 | A1 * | 1/2006 | Loccufier et al. | 430/270.1 |
| 2006/0060096 | A1 * | 3/2006 | Loccufier et al. | 101/453 |

FOREIGN PATENT DOCUMENTS

| | | | |
|---|---|---|---|
| DE | 40 01 466 | A1 | 7/1991 |
| DE | 44 17 907 | A1 | 11/1995 |
| DE | 44 23 140 | A1 | 1/1996 |
| EP | 0 249 139 | A2 | 12/1987 |
| EP | 0 291 760 | | 11/1988 |
| EP | 0 292 801 | | 11/1988 |
| EP | 0 537 633 | A1 | 4/1993 |
| EP | 0 625 728 | A2 | 11/1994 |
| EP | 0 652 483 | A1 | 5/1995 |
| EP | 0 659 909 | A1 | 6/1995 |
| EP | 0 823 327 | A2 | 2/1998 |
| EP | 0 864 420 | A1 | 9/1998 |
| EP | 0 894 622 | A2 | 2/1999 |
| EP | 0 901 902 | A2 | 3/1999 |
| EP | 0 922 570 | A2 | 6/1999 |
| EP | 0 978 376 | A2 | 2/2000 |
| EP | 0 980 754 | A1 | 2/2000 |
| EP | 0 987 104 | A1 | 3/2000 |
| EP | 0 990 516 | A1 | 4/2000 |
| EP | 1 029 667 | A1 | 8/2000 |

(Continued)

OTHER PUBLICATIONS

European Search Report EP 05 11 0568 (Apr. 5, 2006).

*Primary Examiner* — Cynthia Kelly
*Assistant Examiner* — Chanceity Robinson
(74) *Attorney, Agent, or Firm* — Leydig, Voit & Mayer, Ltd.

(57) ABSTRACT

A heat-sensitive lithographic printing plate precursor comprising on a grained and anodized aluminum support a compound which is capable of converting form a hydrophobic state to a hydrophilic state or vice versa upon exposure to heat, and is represented by the following formula:

A-(L)$_n$-B wherein L represents a linking group, n represents 0 or 1 and B represents a thermo-labile group;

characterized in that the compound further comprises the group A which is a functional group capable of interacting with the surface of a grained and anodized aluminum support and is selected from the list consisting of a halosilanyl group, an alkoxysilanyl group, a phosphonic acid group or a salt thereof, a phosphoric acid group or a salt thereof, a salicylic acid group or a salt thereof, a boronic acid group or an ester or a salt thereof, an optionally substituted di or tri-hydroxyaryl group, an optionally substituted salicaldoxime group, an optionally substituted salicaldimine group, an optionally substituted hydroxyheteroaryl group, an amidine group, a 1,3-dicarbonyl group or a group represented by the formula (i)

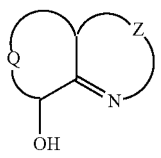

wherein Q and Z independently represent the necessary atoms to form an optionally substituted five or six membered aromatic or heteroaromatic ring.

7 Claims, No Drawings

FOREIGN PATENT DOCUMENTS

| | | | |
|---|---|---|---|
| EP | 1 053 868 | A2 | 11/2000 |
| EP | 1 093 934 | A1 | 4/2001 |
| EP | 1 138 481 | A2 | 10/2001 |
| EP | 1 225 041 | A2 | 7/2002 |
| EP | 1 235 105 | A2 | 8/2002 |
| EP | 1 342 568 | A1 | 9/2003 |
| GB | 1084070 | | 9/1967 |
| WO | WO 92/09934 | A1 | 6/1992 |
| WO | WO 97/39894 | A1 | 10/1997 |
| WO | WO 00/28214 | A1 | 5/2000 |
| WO | WO 00/32705 | A1 | 6/2000 |
| WO | WO 2004/011260 | A1 | 2/2004 |

* cited by examiner

LITHOGRAPHIC PRINTING PLATE PRECURSOR COMPRISING BI-FUNCTIONAL COMPOUNDS

CROSS-REFERENCE TO RELATED PATENT APPLICATIONS

This application claims the benefit of U.S. Provisional Application No. 60/737,106 filed Nov. 16, 2005, which is incorporated by reference. In addition, this application claims the benefit of European Application No. 05 110 568.2 filed Nov. 10, 2005, which is also incorporated by reference.

DESCRIPTION

1. Field of the Invention

The present invention relates to heat-sensitive printing plate precursors comprising a bi-functional compound capable of switching form a hydrophobic state to a hydrophilic state or vice versa upon exposure to heat and to a new class of compounds capable of switching form a hydrophobic state to a hydrophilic state.

2. Background of the Invention

Lithographic printing presses use a so-called printing master such as a printing plate which is mounted on a cylinder of the printing press. The master carries a lithographic image on its surface and a print is obtained by applying ink to said image and then transferring the ink from the master onto a receiver material, which is typically paper. In conventional, so-called "wet" lithographic printing, ink as well as an aqueous fountain solution (also called dampening liquid) are supplied to the lithographic image which consists of oleophilic (or hydrophobic, i.e. ink-accepting, water-repelling) areas as well as hydrophilic (or oleophobic, i.e. water-accepting, ink-repelling) areas. In so-called driographic printing, the lithographic image consists of ink-accepting and ink-abhesive (ink-repelling) areas and during driographic printing, only ink is supplied to the master.

Printing masters are generally obtained by the image-wise exposure and processing of an imaging material called plate precursor. In addition to the well-known photosensitive, so-called pre-sensitized plates, which are suitable for UV contact exposure through a film mask, also heat-sensitive printing plate precursors have become very popular in the late 1990s. Such thermal materials offer the advantage of daylight stability and are especially used in the so-called computer-to-plate method wherein the plate precursor is directly exposed, i.e. without the use of a film mask. The material is exposed to heat or to infrared light and the generated heat triggers a (physico-) chemical process, such as ablation, polymerization, insolubilization by cross linking of a polymer, heat-induced solubilization, or by particle coagulation of a thermoplastic polymer latex.

The most popular thermal plates form an image by a heat-induced solubility difference in an alkaline developer between exposed and non-exposed areas of the coating. The coating typically comprises an oleophilic binder, e.g. a phenolic resin, of which the rate of dissolution in the developer is either reduced (negative working) or increased (positive working) by the image-wise exposure. During processing, the solubility differential leads to the removal of the non-image (non-printing) areas of the coating, thereby revealing the hydrophilic support, while the image (printing) areas of the coating remain on the support. Typical examples of such plates are described in e.g. EP-A 625 728, 823 327, 825 927, 864 420, 894 622 and 901 902. Negative working embodiments of such thermal materials often require a pre-heat step between exposure and development as described in e.g. EP-A 625 728.

Some of these thermal processes enable plate making without wet processing and are for example based on ablation of one or more layers of the coating. At the exposed areas the surface of an underlying layer is revealed which has a different affinity towards ink or fountain than the surface of the unexposed coating; as a result, image (printing) and non-image or background (non-printing) areas are obtained. A drawback of such plates is that ablation debris is created which may contaminate the electronics and optics of the exposure device and which needs to be removed from the plate by wiping it with a cleaning solvent, so that ablative plates are often not truly processless. Ablation debris which is deposited onto the plate's surface may also interfere during the printing process and result in for example scumming.

Another type of printing plates based on thermal processes requiring no wet processing step are for example plates based on switching—i.e. plates of which the surface is irreversibly changed from a hydrophilic surface to a hydrophobic surface or vice versa upon exposure to heat and/or light. These so called "switchable polymer systems" are based on different working mechanism such as for example masking/demasking of a polar group or destruction/generation of charge.

EP 652 483 describes a positive-working lithographic printing plate which comprises on a substrate a coating comprising a photothermal converter and a polymer comprising hydrophobic pendant groups such as t-alkyl carboxylates, t-alkyl carbonates, benzyl carboxylates and alkoxyalkyl esters. Upon exposure to heat an acid catalyzed reaction occurs whereby the coating becomes more hydrophilic.

U.S. Pat. No. 5,922,512 discloses a negative-working imaging member which comprises an imaging layer comprising a heat-sensitive polymer with a cyclic anhydride group. The cyclic anhydride group may be present in the polymer backbone or may be present as a pendant group. Upon exposure to heat and/or light the polymer is rendered more hydrophobic.

EP 987 104 discloses a negative-working imaging member which comprises on a support a hydrophilic, heat-sensitive polymer comprising a recurring unit comprising a heat-activatable thiosulfate group which crosslinks upon exposure to heat and thereby becomes more hydrophobic.

WO 2004/011260 discloses a method for making a printing member comprising the steps of (i) coating a substrate with an imaging layer which comprises a hydrophilic heat-sensitive polymer, a crosslinking agent comprising one or more ionic groups and a plurality of epoxy groups, and a photothermal conversion material, and (ii) imagewise exposing the imaging layer.

EP 980 754 discloses a method for making a lithographic printing plate comprising the steps of (i) providing a printing plate precursor comprising on a support a recording layer comprising a photothermal converter and a polymer having a carboxylic acid or a carboxylate group, and (ii) exposing said precursor to infrared light, whereby a thermal decarboxylation reaction occurs.

A negative-working printing plate precursor provided with an imaging layer comprising a heat-sensitive compound including an aromatic cyclic sulfonium zwitterionic group, and a photothermal conversion material such as an infrared absorber, is disclosed in EP 1 225 041.

EP 1 235 105 discloses a printing plate precursor having on a support provided with a hydrophilic graft polymer, a thermosensitive layer comprising a polymer which has a functional group capable of interacting with said hydrophilic graft polymer and a functional group that undergoes a hydrophilic/hydrophobic conversion upon exposure to heat or radiation and/or in the presence of an acid.

The main challenge for creating printing plates based on a chemical "switching" reaction is to provide an imageable surface that has both adequate physical robustness and resistance to toning. The hydrophilic parts of printing plates comprising switchable surfaces which reject ink very well are thus very hydrophilic and may partly dissolve in the fountain solution and thereby lose adhesion to the support or may swell and become prone to abrasion and wear. By increasing the physical robustness of a plate often an increase in toning is observed.

SUMMARY OF THE INVENTION

It is an object of the present invention to provide a heat-sensitive, non-ablative, processless printing plate based on a switching process which is easy to manufacture and which shows no toning. This object is realized by claim 1, i.e. a heat-sensitive lithographic printing plate precursor comprising on a grained and anodized aluminum support a compound represented by the following formula:

$$A\text{-}(L)_n\text{-}B$$

wherein
L represents a linking group,
n represents 0 or 1;
B represents a thermo-labile group;
characterized in that the compound further comprises the group A which is a functional group capable of interacting with the surface of a grained and anodized aluminum support and is selected from the list consisting of a halosilanyl group, an alkoxysilanyl group, a phosphonic acid group or a salt thereof, a phosphoric acid group or a salt thereof, a salicylic acid group or a salt thereof, a boronic acid group or an ester or a salt thereof, an optionally substituted di or tri-hydroxyaryl group, an optionally substituted salicaldoxime group, an optionally substituted salicaldimine group, an optionally substituted hydroxyheteroaryl group, an amidine group, a 1,3-dicarbonyl group or a group represented by the formula (i)

(i)

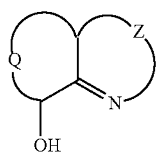

wherein Q and Z independently represent the necessary atoms to form an optionally substituted five or six membered aromatic or heteroaromatic ring.

The thermo-labile group B shows a chemical reaction upon exposure under the influence of heat and/or in the presence of an acid or a base, whereby the polarity of the compound switches from a hydrophobic state to a hydrophilic state or vice versa.

The obtained printing plate can be used for printing after the exposure step without the need for a processing step prior to mounting the plate on a printing press.

It was found that group A present in the compounds according to the present invention provides a sufficient adhesion to the surface of a grained and anodized aluminum support so that said compounds are resistant to fountain solution and/or ink during printing.

According to the present invention, there is also provided a new class of compounds which are capable of interacting with the surface of a grained and anodized aluminum lithographic support and which are capable of switching from a hydrophobic state to a hydrophilic state upon exposure to heat. Said compounds, when applied on a grained and anodized aluminum support, are sufficiently adhered to the surface of said support and are not washed out during the printing step. Furthermore, upon exposure to heat, the compounds provide an excellent ink-receptivity as well as a good water/ink discrimination. The compounds are represented by the following formula:

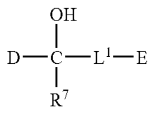

wherein
$L^1$ represents a divalent linking group;
D represents a phosphonic acid group or a salt thereof;
E represents an alkyl carboxylate group;
$R^7$ represents hydrogen, an optionally substituted alkyl, alkenyl or alkynyl group, an optionally substituted aryl or heteroaryl group or a phosphonic acid group or a salt thereof.

Preferred embodiments of the present invention are described in the dependent claims.

DETAILED DESCRIPTION OF THE INVENTION

According to the present invention there is provided a lithographic printing plate precursor comprising on a grained and anodized aluminum support a compound represented by the following formula:

$$A\text{-}(L)_n\text{-}B$$

wherein
L represents a linking group and n represents 0 or 1.

Hereinafter the compound is referred to as the "bi-functional compound". The lithographic printing plate precursor may comprise a coating and the bi-functional compound may be present in said coating. The coating may comprise more than one layer and the layer comprising the bi-functional compound is called the "imaging layer".

Group A represents a functional group capable of interacting with the surface of a grained and anodized aluminum lithographic support. Examples of such interactions include covalent bonds or secondary interactions such as hydrogen bonds, Van der Waals associations, ionic associations or combinations thereof. As a result of these interactions, the bi-functional compound remains adhered on the surface of the lithographic support during the printing step or more specific, during exposing the support to ink and/or an aqueous fountain solution.

Functional group A is represented by the list consisting of a halosilanyl group, an alkoxysilanyl group, a phosphonic acid group or a salt thereof, a phosphoric acid group or a salt thereof, a salicylic acid group or a salt thereof, a boronic acid group or an ester or a salt thereof, an optionally substituted di or tri-hydroxyaryl group, an optionally substituted salicaldoxime group, an optionally substituted salicaldimine group, an optionally substituted hydroxyheteroaryl group, an amidine group, a 1,3-dicarbonyl group or a group represented by the formula (i)

(i)

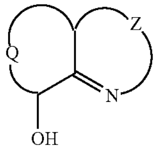

wherein Q and Z independently represent the necessary atoms to form an optionally substituted five or six membered aromatic or heteroaromatic ring. Suitable examples of (i) are a 8-hydroxy-purine group, a 8-hydroxyquinoline group, a 7-hydroxybenzimidazole group, a 7-hydroxybenzpyrazole group or a 7-hydroxybenztriazole group.

In a preferred embodiment, functional group A is represented by a salicylic acid group or a salt thereof, an alkoxysilanyl group, a phosphoric acid group or a salt thereof, a phosphonic acid group or a salt thereof.

In a most preferred embodiment functional group A is represented by a phosphonic acid group or a salt thereof or an alkoxysilanyl group.

Preferred halosilanyl groups are represented by (a) a trihalosilanyl group such as a trichloro- or a tribromosilanyl group, (b) an alkyl-di-halosilanyl group such as an alkyldichloro- and an alkyl-dibromosilanyl group and (c) a dialkyl-halosilanyl group such as a di-alkyl-chloro- and a dialkyl-bromosilanyl group. The alkyl group represents an optionally substituted straight, branched, cyclic or heterocyclic alkyl group having upto 15 carbon atoms.

A most preferred halosilanyl group is a trichlorosilanyl group.

The alkoxysilanyl group may be represented by an alkyl-di-alkoxysilanyl group, a di-alkyl-alkoxysilanyl group or a tri-alkoxysilanyl group. The alkyl group represents an optionally substituted straight, branched, cyclic or heterocyclic alkyl group having up to 15 carbon atoms.

Most preferred is a tri-alkoxysilanyl group and may be represented by the following formula I:

$$*\text{—Si—}(OR^1)_3 \qquad (I)$$

wherein $R^1$ represents an optionally substituted straight, branched, cyclic or heterocyclic alkyl group having up to 15 carbon atoms or an optionally substituted aryl or heteroaryl group. The substituents $R^1$ may combine to from a ring. * represents the bond with *-$(L)_n$-B in the above formula.

A preferred boronic acid group or an ester or a salt thereof is represented by the following formula II:

(II)

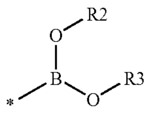

wherein:

$R^2$ and $R^3$ independently represent hydrogen or a counterion to compensate a negative charge of O such as for example $Na^+$, $NH4^+$ or $K^+$, an optionally substituted straight, branched, cyclic or heterocyclic alkyl group having up to 15 carbon or an optionally substituted aryl or heteroaryl group; $R^2$ and $R^3$ may represent the necessary atoms to from a ring. * represents the bond with *-$(L)_n$-B in the above formula.

Preferred 1,3-dicarbonyl compounds are e.g. β-diketones, β-dialdehydes, 1,3-aldehydo-ketones, 1-keto-esters, β-keto-thioesters, β-aldehydo-esters, β-aldehydo-thioesters, β-keto-amides, β-aldehydo-amides, 1,3-diesters, 1,3-dithiolesters, or 1,3-diamides.

A preferred amidine group can be represented by the following formula (III):

(III)

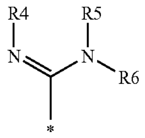

wherein:

$R^4$ to $R^6$ each independently represent hydrogen, an optionally substituted straight, branched, cyclic or heterocyclic alkyl group having up to 15 carbon atoms, an optionally substituted aryl or heteroaryl group;

$R^4$ and $R^5$, $R^4$ and $R^6$ or $R^5$ and $R^6$ can represent the necessary atoms to form a ring; most preferably $R^4$ and $R^5$ combine together to form a heterocyclic ring, most preferably an imidazoline ring. * represents the bond with *-$(L)_n$-B in the above formula.

Group B represents a thermo-labile group which reacts upon exposure under the influence of heat and/or in the presence of an acid or a base whereby the polarity of the bi-functional compound is converted from a hydrophobic state into a hydrophilic state or vice versa. Typical reactions which provide such a polarity switch include elimination reactions, cyclisation reactions, crosslinking reactions or decarboxylation reactions. Thermo-labile groups are extensively described in the following references: EP 987,104, U.S. Pat. No. 5,922,512, EP 980,754, EP 1,138,481, EP 249,139, U.S. Pat. No. 4,963,463, WO 92/09934, EP 652,483 and EP 922, 570

Examples of group B which result in a switch of the bi-functional compound from a hydrophilic state to a hydrophobic state are groups comprising a thiosulfate group or a salt thereof, a cyclic anhydride group, a cyclic imide group, a carboxylic acid group or a salt thereof, a sulfonic acid group or a salt thereof, a sulphuric acid group or a salt thereof, a sulfinyl group, a phosphoric acid group or a salt thereof, a phosphonic acid group or a salt thereof, or a group comprising an onium group such as an ammonium, iodonium, sulphonium or phosphonium salt.

Examples of group B which result in a switch of the bi-functional compound from a hydrophobic state to a hydrophilic state are:

- an optionally substituted straight, branched, cyclic, heterocyclic alkyl group wherein the polarity switch may occur by an elimination reaction;
- a group comprising a carboxylate group such as
  - an alkyl carboxylate group wherein the alkyl group is represented by an optionally substituted straight, branched, cyclic or heterocyclic alkyl group and wherein the carbon atom attached to the carboxylate group is preferably a tertiary carbon atom, e.g. t-butyl carboxylate,
  - an alkoxyalkyl carboxylate group,
  - a benzyl carboxylate group e.g. nitrobenzyl carboxylate, cyanobenzyl carboxylate or dimethylbenzyl carboxylate,
  - an oxime carboxylate group,

- a group comprising a carbonate group such as
  - an alkyl carbonate group wherein the alkyl group is represented by an optionally substituted straight, branched, cyclic or heterocyclic alkyl group and wherein the carbon atom attached to the carboxylate group is preferably a tertiary carbon atom, e.g. t-butyl carbonate,
  - an alkoxyalkyl carbonate group,
  - a benzyl carbonate group,
  - an oxime carbonate group,
- a group comprising a carbamate group such as
  - an alkyl carbamate group wherein the alkyl group is represented by an optionally substituted straight, branched, cyclic or heterocyclic alkyl group,
  - an alkoxyalkyl carbamate group,
  - a benzyl carbamate group,
  - an oxime carbamate group;
- $—PO—(OR^a)_2$, $—SO_2—O—R^b$, $OPO—(OR^c)_2$, $—OSO_2—O—R^d$, $—SO_2—SO_2—R^e$, $—SO_2—NR^f—SO_2—R^g$ wherein $R^a$ to $R^g$ each represent an optionally substituted alkyl group (straight, branched, cyclic, or heterocyclic alkyl group) or an aryl group, or $R^a$ to $R^d$ represent a cyclic imide group or $R^f$ represents $—SO_2—R^h$ wherein $R^h$ represents an optionally substituted alkyl straight, branched, cyclic, or heterocyclic alkyl group or an aryl group.

In a preferred embodiment, the bi-functional compound comprises group A represented by a phosphonic acid group or a salt thereof, a phosphoric acid group or a salt thereof, an optionally substituted di or tri-hydroxyaryl group, an alkoxysilanyl group or a salicylic acid group and group B is represented by an optionally substituted straight, branched, cyclic or heterocyclic alkyl group, an alkyl carboxylate group wherein the carbon atom attached to the carboxylate group is preferably a tertiary carbon atom, an alkoxyalkyl carboxylate group or a benzyl carboxylate group.

In another preferred embodiment, the bi-functional compound comprises group A represented by a phosphonic acid group or a salt thereof, a phosphoric acid group or a salt thereof, an optionally substituted di or tri-hydroxyaryl group, an alkoxysilanyl group or a salicyclic acid group and group B is represented by a carboxylic acid group or a salt thereof, a sulfonic acid group or a salt thereof, or a sulphuric acid group or a salt thereof.

In a most preferred embodiment the bi-functional compound comprises the functional group A represented by a phosphoric acid group or a salt thereof or a phosphonic acid group or a salt thereof and the group B is represented by an optionally substituted straight, branched, cyclic, or heterocyclic alkyl group. In this preferred embodiment it is believed that an elimination reaction transforms the bi-functional compound from a hydrophobic state to a hydrophilic state.

The substituents optionally present on the straight, branched, cyclic or heterocyclic alkyl group may be represented by a halogen such as a chlorine or bromine atom, a hydroxyl group, an aryl group, an amino group, (di)alkylamino group or an alkoxy group.

The linking groups L of the bi-functional compound preferably represents an optionally substituted alkylene group, an optionally substituted arylene, an optionally substituted heteroarylene, —SO—, $—SO_2—$, —CH═N—, —NH—NH—, $—O—(CH_2)_k—$, $—(CH_2)_k—O—$, $—(CH_2)_k—O—CO—(CH_2)_l—$, $—(CH_2)_k—COO—(CH_2)_1—$, $—(CH_2)_k—NH—$, $—NH—(CH_2)_k—$, $—(CH_2)_k—CONH—$, $—(CH_2)_k—NHCO—$, $—(CH_2)_k—CONH—SO_2—$, $—NH—(CH_2)_k—(CH_2)_l-$, $—CO—(CH_2)_k$, $—(CH_2)_k—CO—$, —NH—CO—O—, —O—CO—NH, $—NH—CO—(CH_2)_k—$, —NH—CO—NH—, —NH—CS—NH—, or combinations thereof; and wherein k and l independently represent 0 or an integer equal to or greater than 1, and the substituents optional present on the alkylene, the arylene or the heteroarylene group may be represented by an alkyl group, a halogen such as a chlorine or bromine atom, a hydroxyl group, an amino group, (di)alkylamino group, an alkoxy group a phosponic acid group or a salt thereof.

Specific examples of group B which result in a conversion of the bi-functional compound from a hydrophilic state to a hydrophobic state upon heating and/or in the presence of an acid, and the associated conversion reactions which are believed to occur, are presented below:

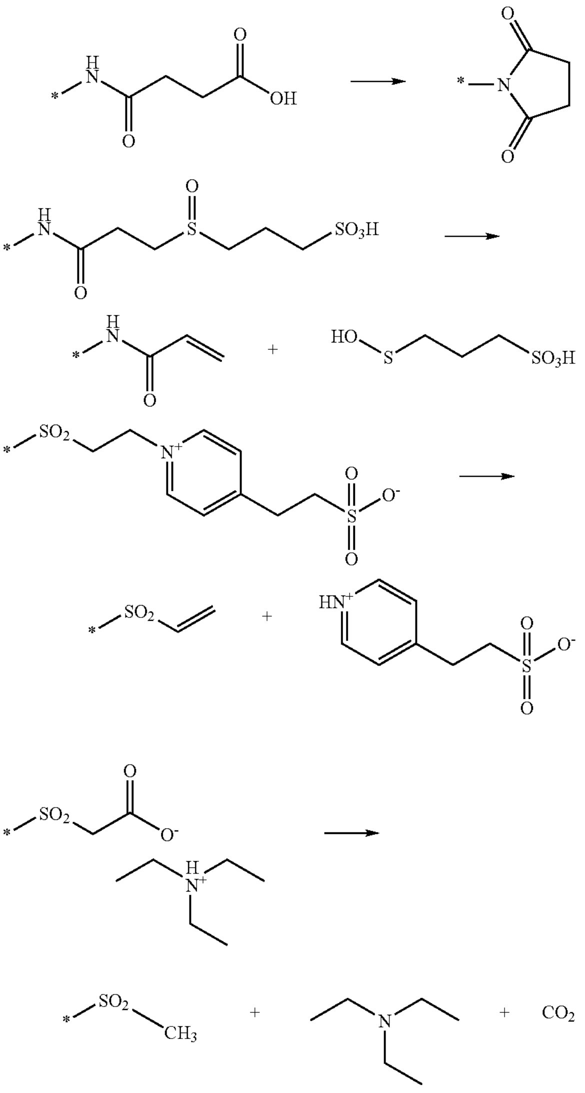

* indicates the bond to the bi-functional compound.

Specific examples of group B which result in a conversion of the bi-functional compound from a hydrophobic state to a hydrophilic state upon heating and/or in the presence of an acid, and the associated conversion reactions which are believed to occur, are presented below:

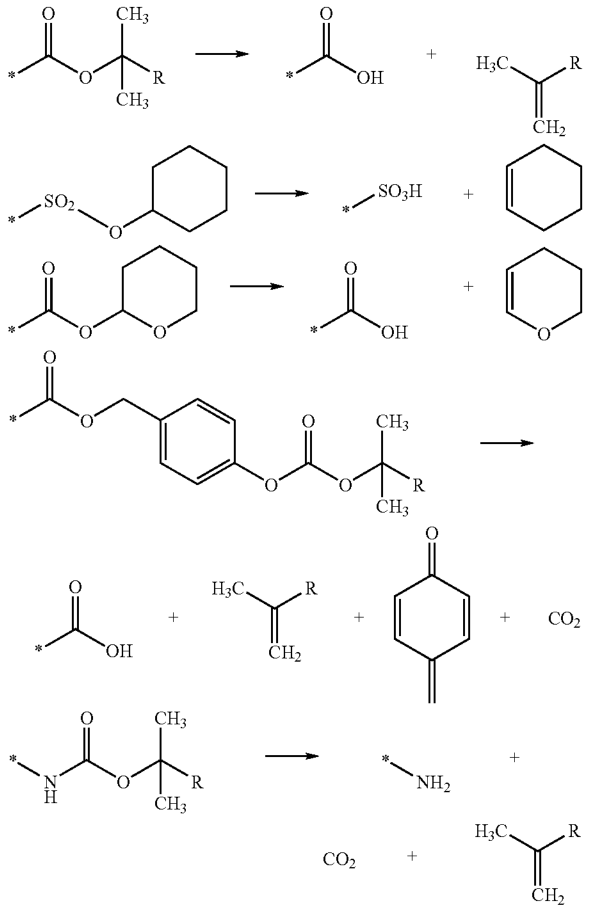

* indicates the bond to the bi-functional compound; R represents a substituent.

All statements herein regarding reactions which provide the polarity switch are believed to occur to the present knowledge of the inventors but shall not be taken into account for determining the scope of protection defined by the appending claims.

According to the present invention there is also provided a bi-functional compound I according to the following formula (and referred to hereinafter as the "bi-functional compound I"):

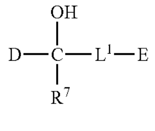

wherein $R^7$ represents hydrogen, an optionally substituted alkyl, alkenyl or alkynyl group, an optionally substituted aryl or heteroaryl group or a phosphonic acid group or a salt thereof;

D represents a phosphonic acid group or a salt thereof;

E represents an alkyl carboxylate group wherein the alkyl group is represented by a an optionally substituted straight, branched, cyclic or heterocyclic alkyl group, preferably the carbon atom attached to the carboxylate group is a secondary or tertiary carbon atom, and $L^1$ represents a divalent linking group.

The linking group $L^1$ preferably represents an optionally substituted alkylene group, an optionally substituted arylene, an optionally substituted heteroarylene, —SO—, —$SO_2$—, —CH═N—, —NH—NH—, —O—$(CH_2)_k$—, —$(CH_2)_k$—O—, —$(CH_2)_k$—O—CO—$(CH_2)_l$—, —$(CH_2)_k$—COO—$(CH_2)_l$—, —$(CH_2)_k$—NH—, —NH—$(CH_2)_k$—, —$(CH_2)_k$—CONH—, —$(CH_2)_k$—CONH—$SO_2$—, —NH—$(CH_2)_k$—O—$(CH_2)_l$—, —CO—$(CH_2)_k$, —O—CO—NH, —NH—CO—$(CH_2)_k$—, —NH—CO—NH—, —NH—CS—NH—, or combinations thereof; and wherein k and l independently represent 0 or an integer equal to or greater than 1, and the substituents optional present on the alkylene, the arylene or the heteroarylene group may be represented by an alkyl group, a halogen such as a chlorine or bromine atom, a hydroxyl group, an amino group, (di)alkylamino group or an alkoxy group.

In a preferred embodiment, the linking group $L^1$ represents an optionally substituted alkylene group. The substituents optional present on the alkylene group may be represented by an alkyl group, a halogen such as a chlorine or bromine atom, a hydroxyl group, an amino group, (di)alkylamino group or an alkoxy group.

According to the present invention there is also provided a lithographic printing plate precursor comprising on a support the bi-functional compound I. The lithographic printing plate precursor comprising the bi-functional compound I may comprise a coating and the bi-functional compound I may be present in said coating. The coating may comprise more than one layer and the layer comprising the bi-functional compound I is called the imaging layer.

Suitable bi-functional compounds capable of switching from a hydrophilic state to a hydrophobic state are given below:

BF-compound 1

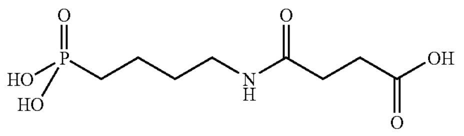

BF-compound 2

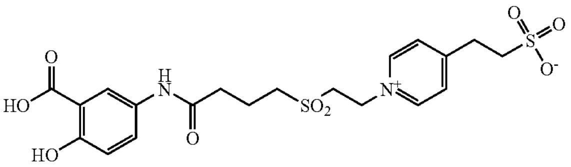

BF-compound 3

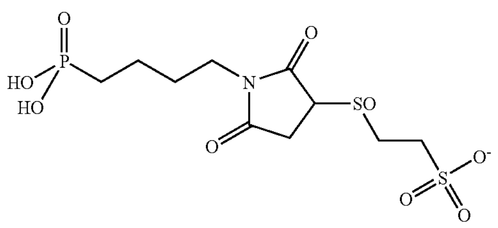

-continued
BF-compound 4
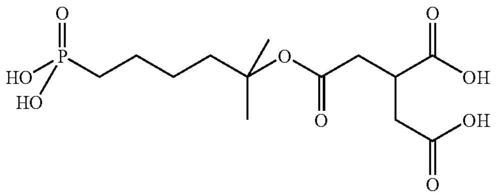
BF-compound 5
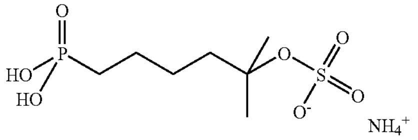
BF-compound 6
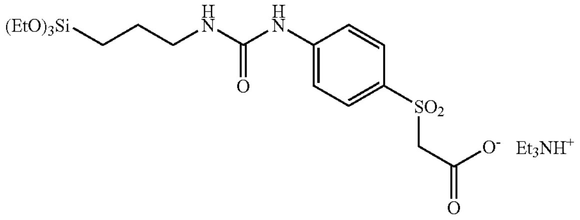
-continued
BF-compound 7
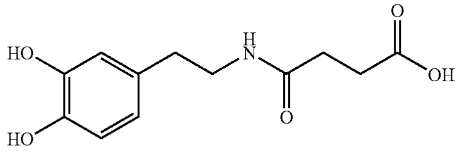
BF-compound 8
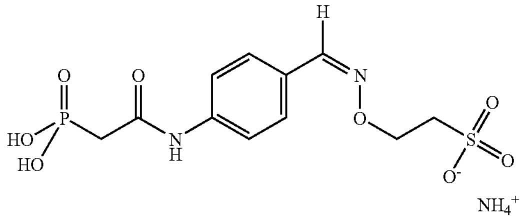
Suitable bi-functional compounds capable of switching from a hydrophobic state to a hydrophilic state are given below:
BF-compound 9
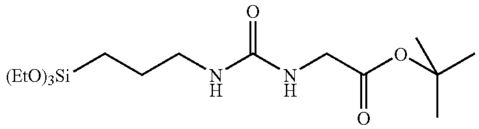
BF-compound 10
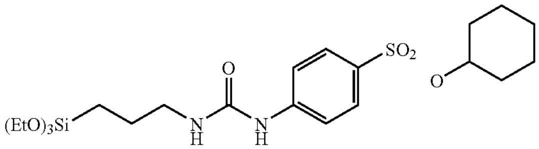
BF-compound 11
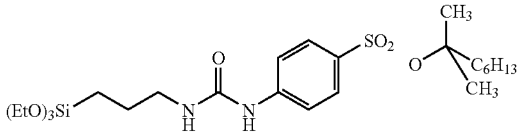
BF-compound 12
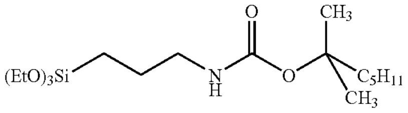
BF-compound 13
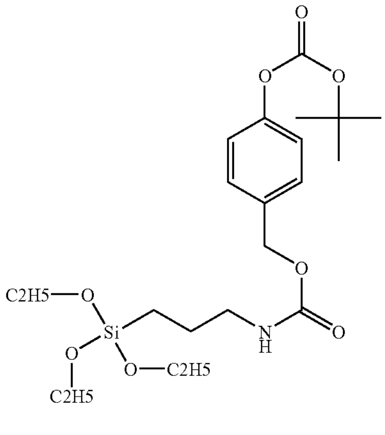
BF-compound 14
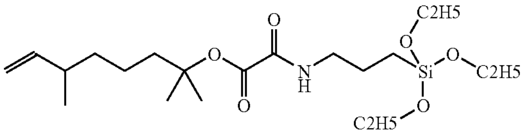
BF-compound 15
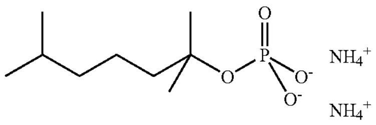
BF-compound 16
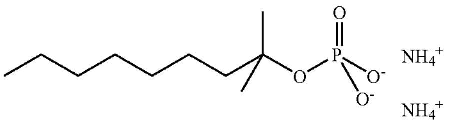

-continued
BF-compound 17
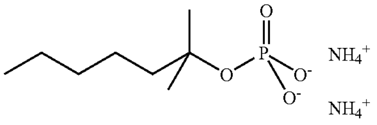
BF-compound 18
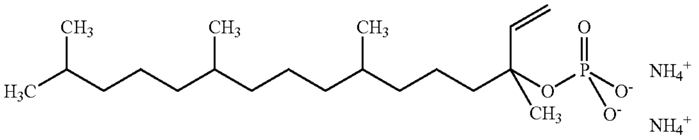
BF-compound 19
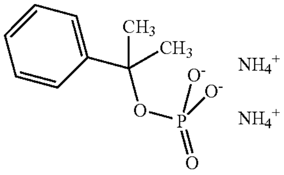
BF-compound 20
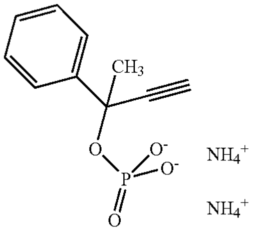
BF-compound 21
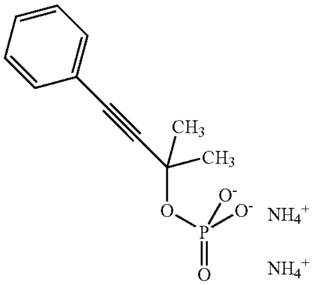
BF-compound 22
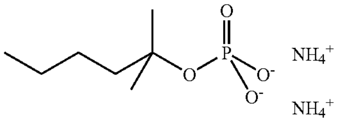
BF-compound 23
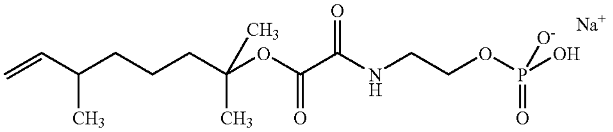
BF-compound 24
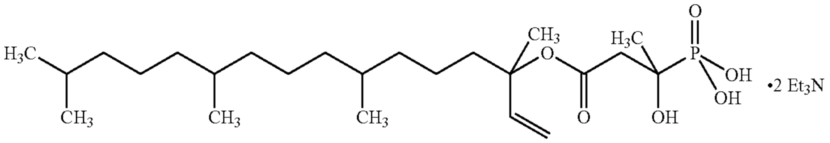
BF-compound 25
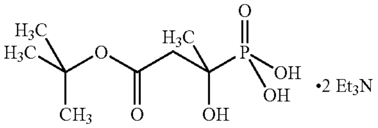
BF-compound 26
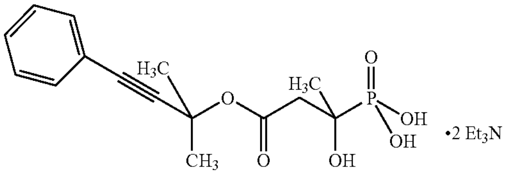
BF-compound 27
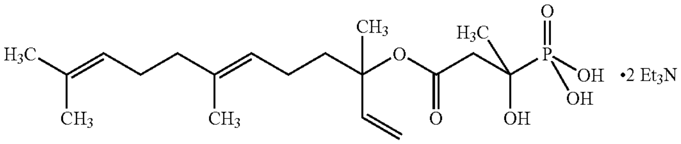
BF-compound 28
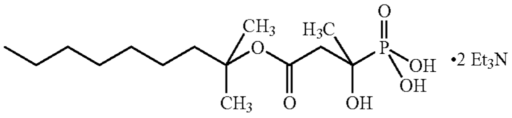
BF-compound 29
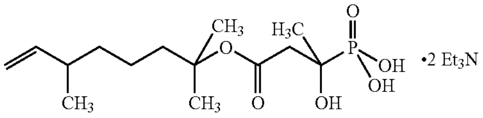

-continued
BF-compound 30
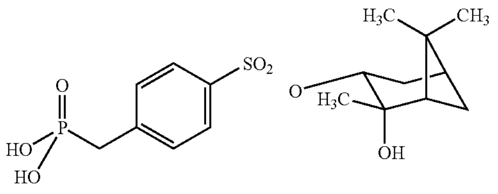
BF-compound 31
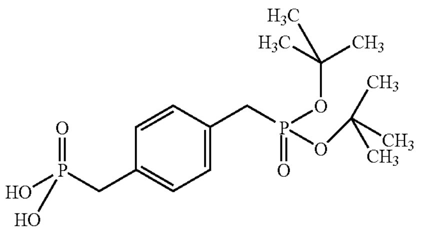
BF-compound 32
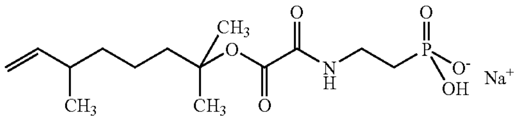
BF-compound 33
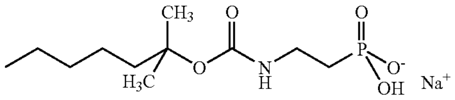
BF-compound 34
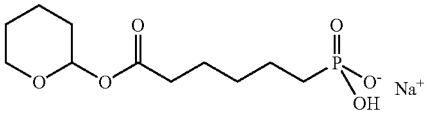
BF-compound 35
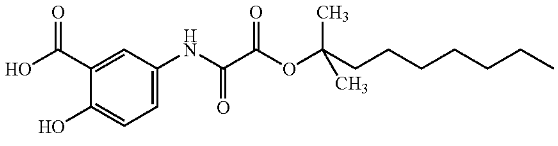
BF-compound 36
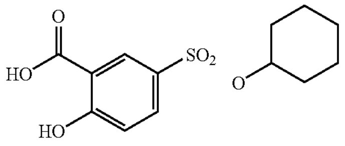
BF-compound 37
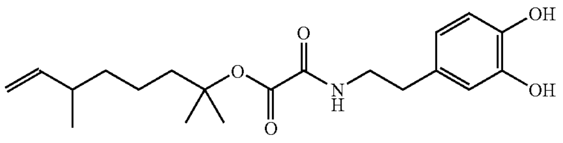
BF-compound 38
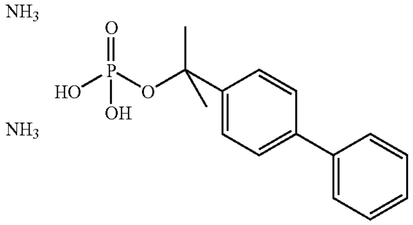
BF-compound 39
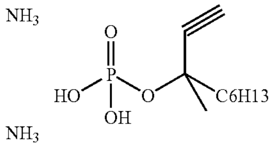
BF-compound 40
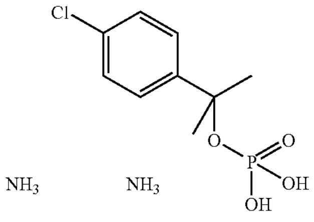
BF-compound 41
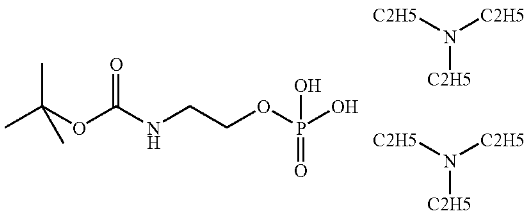
BF-compound 42
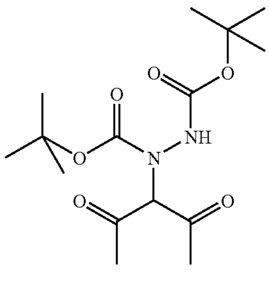

The support of the lithographic printing plate precursor is a grained and anodized aluminum support. The support may be a sheet-like material such as a plate or it may be a cylindrical element such as a sleeve which can be slid around a print cylinder of a printing press. The support can also be a laminate comprising an aluminum foil and a plastic layer, e.g. polyester film.

The aluminum is preferably grained by electrochemical graining, and preferably anodized by means of anodizing techniques employing phosphoric acid or a sulphuric acid/phosphoric acid mixture. Methods of both graining and anodization of aluminum are very well known in the art.

By graining (or roughening) the aluminum support, s both the adhesion of the printing image and the wetting characteristics of the non-image areas are improved. By varying the type and/or concentration of the electrolyte and the applied voltage in the graining step, different type of grains can be obtained.

By anodizing the aluminum support, its abrasion resistance and hydrophilic nature are improved. The microstructure as well as the thickness of the $Al_2O_3$ layer are determined by the anodizing step, the anodic weight (g/m$^2$ $Al_2O_3$ formed on the aluminum surface) varies between 1 and 8 g/m$^2$.

The grained and anodized aluminum support may be post-treated to improve the hydrophilic properties of its surface. The bi-functional compound may be present in such a post-treatment solution or solutions. For example, the aluminum oxide surface may be silicated by treating its surface with a sodium silicate solution at elevated temperature, e.g. 95° C. Alternatively, a phosphate treatment may be applied which involves treating the aluminum oxide surface with a phosphate solution that may further contain an inorganic fluoride. Further, the aluminum oxide surface may be rinsed with an organic acid and/or salt thereof, e.g. carboxylic acids, hydrocarboxylic acids, sulphonic acids or phosphonic acids, or their salts, e.g. succinates, phosphates, phosphonates, sulphates, and sulphonates. A citric acid or citrate solution is preferred. This treatment may be carried out at room temperature or may be carried out at a slightly elevated temperature of about 30° C. to 50° C. A further interesting treatment involves rinsing the aluminum oxide surface with a bicarbonate solution. Still further, the aluminum oxide surface may be treated with polyvinylphosphonic acid, polyvinylmethylphosphonic acid, phosphoric acid esters of polyvinyl alcohol, polyvinylsulfonic acid, polyvinylbenzenesulfonic acid, sulfuric acid esters of polyvinyl alcohol, and acetals of polyvinyl alcohols formed by reaction with a sulfonated aliphatic aldehyde. It is further evident that one or more of these post treatments may be carried out alone or in combination. More detailed descriptions of these treatments are given in GB 1084070, DE 4423140, DE 4417907, EP 659909, EP 537633, DE 4001466, EP A 292801, EP A 291760 and U.S. Pat. No. 4,458,005. In a preferred embodiment, the grained and anodized aluminum support is not post-treated.

The coating may further contain one or more compounds which absorbs infrared light and convert the absorbed energy into heat. The amount of infrared absorbing agent in the coating is preferably at least 4% by weight, more preferred at least 6% by weight. In a preferred embodiment, its concentration is at least 35% by weight, more preferably at least 45% by weight. When the coating comprises more than one distinct layer, at least one of these layers may comprise the infrared absorbing agent(s). Examples of suitable IR absorbers are described in e.g. EP-As 823327, 978376, 1029667, 1053868, 1093934; WO 97/39894 and 00/29214. A preferred compound is the following cyanine dye IR-A:

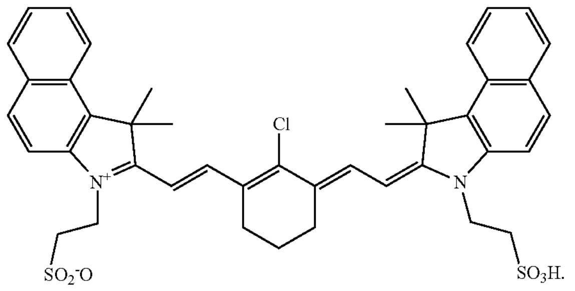

Infrared absorbing dyes which become intensively colored after exposure by infrared irradiation or heating and thereby form a visible image, are particularly preferred. The dyes described in EP 1 614 541 and PCT 2006/063327 are of special interest, especially the dyes disclosed in these references with formulae I, II, III, IV, II-10, II-11, II-20, II-21, III-10, III-11, III-20, III-21, IV-10, IV-11, IV-20, IV-21, V-a, V-b, V-c and V-d and IRD-001 up to IRD-102. More specific, the dyes V-a, V-b, V-c and V-d are particularly preferred:

formula V-a

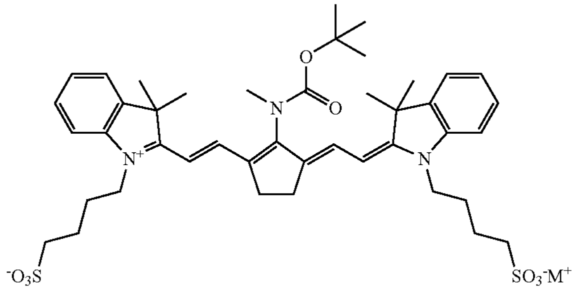

formula V-b

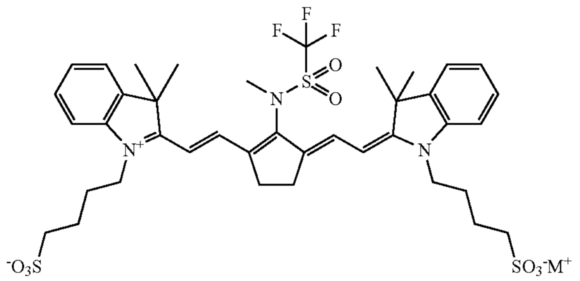

formula V-c

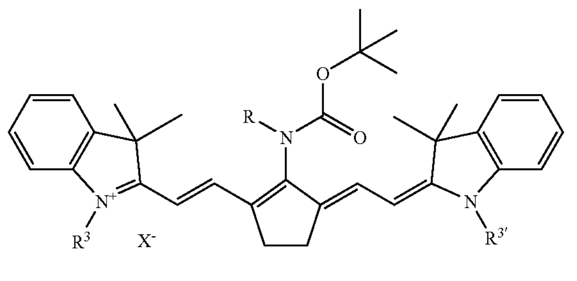

-continued formula V-d

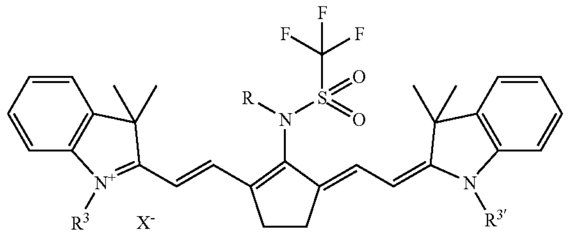

wherein $M^+$=$Li^+$, $Na^+$, $K^+$, $NH_4^+$, R'R"R'"$NH^+$ wherein R', R", R'" are independently a H atom, an optional substituted alkyl or aryl group;

X=halogen, sulphonate, perfluorosulphonate or arylsulphonate;

$R^3$, $R^{3'}$ are methyl or ethyl.

To protect the surface of the coating, in particular from mechanical damage, a protective layer may also optionally be applied. The protective layer generally comprises at least one water-soluble polymeric binder, such as polyvinyl alcohol, polyvinylpyrrolidone, partially hydrolyzed polyvinyl acetates, gelatin, carbohydrates or hydroxyethylcellulose, and can be produced in any known manner such as from an aqueous solution or dispersion which may, if required, contain small amounts, i.e. less than 5% by weight, based on the total weight of the coating solvents for the protective layer, of organic solvents. The thickness of the protective layer can suitably be any amount, advantageously up to 5.0 μm, preferably from 0.05 to 3.0 μm, particularly preferably from 0.10 to 1.0 μm.

The coating may in addition to the image-recording layer i.e. the layer comprising the bi-functional compound or the bi-functional compound I, also contain one or more additional layer(s).

Optionally, the coating may further contain additional ingredients. These ingredients may be present in the image-recording layer or in on optional other layer. For example, one or more binders, polymer particles such as matting agents and spacers, surfactants such as perfluoro surfactants, silicon or titanium dioxide particles, or colorants are well-known components of lithographic coatings. Other additional ingredients may include acids and/or thermo-acids or bases and/or thermo-bases.

The bi-functional compounds and the bi-functional compounds I of the present invention may be applied on to the support via the post-treatment solution (see above), by wet coating or by other known methods such as for example vapor deposition or spray coating.

The printing plate precursor of the present invention can be image-wise exposed directly with heat, e.g. by means of a thermal head, or indirectly by infrared light, preferably near infrared light. The infrared light is preferably converted into heat by an IR light absorbing compound as discussed above. The heat-sensitive lithographic printing plate precursor of the present invention is preferably not sensitive to visible light. Most preferably, the coating is not sensitive to ambient daylight, i.e. visible (400-750 nm) and near UV light (300-400 nm) at an intensity and exposure time corresponding to normal working conditions so that the material can be handled without the need for a safe light environment.

The printing plate precursors of the present invention can be exposed to infrared light by means of e.g. LEDs or an infrared laser. Preferably, the light used for the exposure is a laser emitting near infrared light having a wavelength in the range from about 700 to about 1500 nm, e.g. a semiconductor laser diode, a Nd:YAG or a Nd:YLF laser. The required laser power depends on the sensitivity of the image-recording layer, the pixel dwell time of the laser beam, which is determined by the spot diameter (typical value of modern plate-setters at $1/e^2$ of maximum intensity : 10-25 μm), the scan speed and the resolution of the exposure apparatus (i.e. the number of addressable pixels per unit of linear distance, often expressed in dots per inch or dpi; typical value : 1000-4000 dpi).

Two types of laser-exposure apparatuses are commonly used: internal (ITD) and external drum (XTD) plate-setters. ITD plate-setters for thermal plates are typically characterized by a very high scan speed up to 1500 m/sec and may require a laser power of several Watts. The Agfa Galileo T (trademark of Agfa Gevaert N.V.) is a typical example of a plate-setter using the ITD-technology. XTD plate-setters for thermal plates having a typical laser power from about 20 mW to about 500 mW operate at a lower scan speed, e.g. from 0.1 to 20 m/sec. The Creo Trendsetter plate-setter family (trademark of Creo) and the Agfa Xcalibur plate-setter family (trademark of Agfa Gevaert N.V.) both use the XTD-technology.

According to the present invention there is also provided a method for making a printing plate comprising the steps of (i) providing a printing plate precursor as disclosed above and (ii) image-wise exposing said precursor directly with heat, e.g. by means of a thermal head, or indirectly by infrared light, preferably near infrared light. The details concerning the exposure step are explained above.

The printing plate is most preferably after exposure mounted on a printing press where after the print job is started by applying ink and/or dampening liquid without first processing the exposed plate.

In a specific embodiment, the material may be developed by supplying to the coating an aqueous alkaline solution, and/or a suitable solvent, and/or a gum solution and/or by rinsing it with plain water or an aqueous liquid, whereby the non-image areas of the coating are removed. The gum solution which can be used in the development step, is typically an aqueous liquid which comprises one or more surface protective compounds that are capable of protecting the lithographic image of a printing plate against contamination or damaging. Suitable examples of such compounds are film-forming hydrophilic polymers or surfactants. The gum solution has preferably a pH from 4 to 10, more preferably from 5 to 8. Preferred gum solutions are described in EP 1,342,568.

The developing step may be combined with mechanical rubbing, e.g. by a rotating brush. During the development step, any water-soluble protective layer present is preferably also removed.

The development step with an aqueous alkaline solution may be followed by a rinsing step and/or a gumming step. The gumming step involves post-treatment of the lithographic printing plate with a gum solution. The gum solution (as described above) is typically an aqueous liquid which comprises one or more surface protective compounds that are capable of protecting the lithographic image of a printing plate against contamination or damaging.

The printing plate can, if required, be post-treated with a suitable correcting agent or preservative as known in the art.

The printing plate can be used for conventional, so-called wet offset printing, in which ink and an aqueous dampening liquid are supplied to the plate. Another suitable printing method uses so-called single-fluid ink without a dampening liquid. Suitable single-fluid inks have been described in U.S. Pat. Nos. 4,045,232; 4,981,517 and 6,140,392. In a most preferred embodiment, the single-fluid ink comprises an ink phase, also called the hydrophobic or oleophilic phase, and a polyol phase as described in WO 00/32705.

EXAMPLES

Preparation of the bi-functional compounds BF-compound 9, 13 to 22, 24 to 27, 30, 38 to 42.

Synthesis of BF-Compound 9.

2.0 g (12 mmol) of glycine tert. butyl ester chlorohydrate is dissolved in 25 ml water and 6 ml 2N NaOH. The aqueous solution is extracted twice with 25 ml ethylacetate. The pooled organic fractions are dried over $MgSO_4$ and evaporated under reduced pressure.

0.9 g (3.8 mmol) 3-(triethoxysilyl)propyl isocyanate is dissolved in 5 ml toluene. A solution of 0.5 g (3.8 mmol) glycine tert. butyl ester in 5 ml toluene is added over 10 minutes. The temperature rises to 30° C. The reaction is allowed to continue at room temperature for 2 hours. The solvent is removed under reduced pressure and BF-compound 9 was obtained.

Reaction scheme:

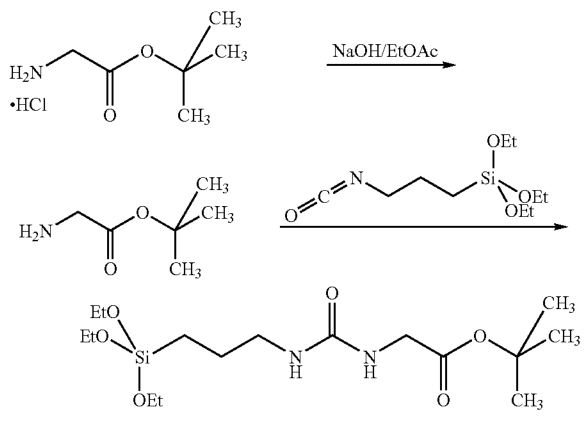

Synthesis BF-Compound 13.

4-(tert-butoxycarbonyl)benzyl alcohol was prepared according to Ito et al., Macromolecular Chemistry and Physics (2000), 201(1), 132-138.

2.5 g (11 mmol) 4-(tert-butoxycarbonyl)benzyl alcohol was dissolved in 40 ml acetone. 0.35 g (0.55 mmol) dibutyltin dilaurate and 2.75 g (11 mmol) 3-(triethoxysilyl)propyl isocyanate were added. The mixture was refluxed for one and a half hour. 5 mol % excess of the isocyanate was added and the mixture was refluxed for an additional 4 hours. BF-compound 13 was obtained.

Reaction scheme:

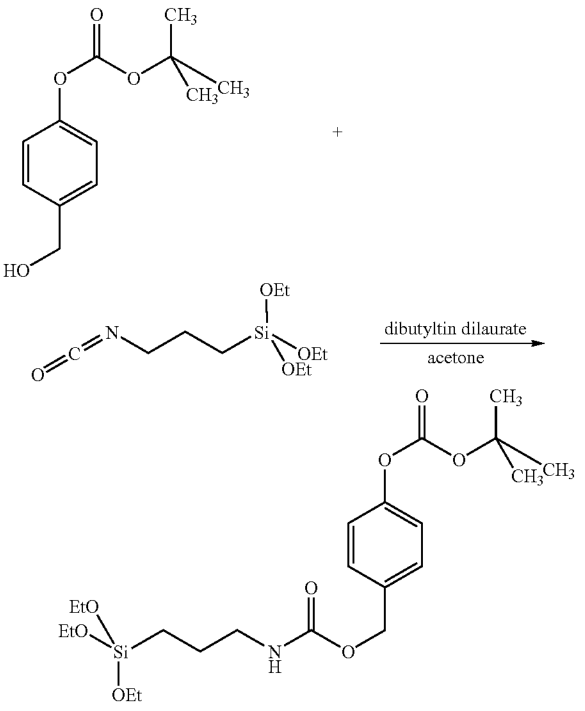

Synthesis of BF-Compound 14.

9.4 g (60 mmol) dihydromyrcenol was dissolved in 140 ml THF. 6.7 g (66 mmol) triethyl amine and 0.4 g (3 mmol) dimethylaminopyridine were added and the reaction mixture was cooled to −5° C. 9.0 g (66 mmol) ethyl oxalylchloride was added dropwise while the temperature was kept below 0° C. The reaction was allowed to continue for 3 hours at room temperature. 200 ml tert. butyl methyl ether was added and the reaction mixture was extracted twice with 200 ml brine (saturated NaCl). The organic fraction was dried over $MgSO_4$ and evaporated under reduced pressure. 15.4 g of the intermediate was isolated, with a purity of 96% based on $^1$H-NMR-spectroscopy.

3.1 g (12 mmol) of the intermediate ester was dissolved in 40 ml ethanol and 3.2 g (14.4 mmol) aminopropyl-triethoxysilane was added. The reaction was allowed to continue for 3 hours at room temperature. The solvent was evaporated under reduced pressure and the oily residue was flushed with nitrogen. BF-compound 14 was obtained.

Reaction scheme:

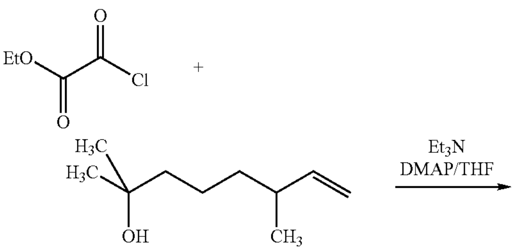

-continued

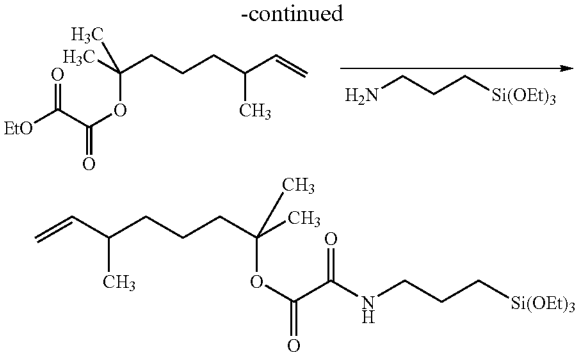

Synthesis of BF-Compound 15.

BF-compound 15 was prepared in the same way as BF-compound 22 (see below) using 2,6 di-methylheptane-2-ol instead of 2-methylhexane-2-ol.

Synthesis of BF-Compound 16.

BF-compound 16 was prepared in the same way as BF-compound 22 (see below) using 2-methylnonane-2-ol instead of 2-methylhexane-2-ol.

Synthesis of BF-Compound 17.

BF-compound 17 was prepared in the same way as BF-compound 22 (see below) using 2-methylheptane-2-ol instead of 2-methylhexane-2-ol.

Synthesis BF-Compound 18.

BF-compound 18 was prepared in the same way as BF-compound 19 (see below) starting from isophytol.

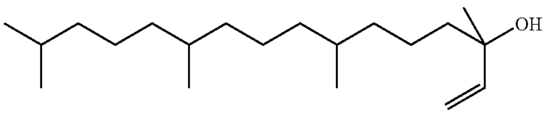

isophytol

Synthesis of BF-Compound 19.

19.6 g (0.2 mol) crystalline phosphoric acid was dissolved in 100 ml acetonitrile. 40.4 g (0.4 mol, 55.6 ml) triethyl amine was added and the reaction mixture was diluted to 250 ml. 3 ml of water was added to dissolve all salts.

12 ml of this solution, containing 9.5 mmol phosphoric acid bis triethylammonium salt, was added dropwise over 2 hours to a stirred mixture of 3 g (22.0 mmol) 2-phenyl-2-propanol and 6 g (41.6 mmol) trichloroacetonitrile. The solvent was removed under reduced pressure and the residue was dissolved in ethanol. A gentle stream of ammonia was let into the mixture for one and a half hour, first at room temperature for half an hour and then at 0° C. for an hour. 100 ml of acetone was added to the resulting suspension and the crude product was isolated by filtration and dried. The crude product BF-compound 19 was treated several times with methanol, isolated by filtration and dried. A second crop was isolated by evaporating the filtrates. The residue was re-dissolved in 10 ml pyridine and 2 ml water. A gentle stream of ammonia was let into the mixture until nothing separated anymore from the mixture. 100 ml of acetone was added and the precipitated BF-compound 19 was isolated by filtration and dried under reduced pressure. 570 mg of BF-compound 19 was isolated.

Reaction scheme:

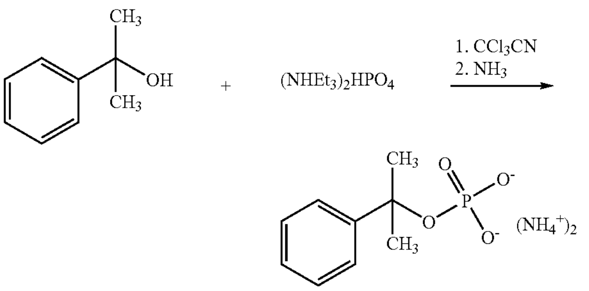

Synthesis of BF-Compound 20.

BF-compound 20 was prepared in the same way as BF-compound 19 using 2-phenyl-but-3-yn-2-ol (see below) instead of 2-phenyl-2-propanol.

Synthesis of BF-Compound 21.

BF-compound 20 was prepared in the same way as BF-compound 19 using 2-methyl-4-phenyl-but-3-yn-2-ol (see below) instead of 2-phenyl-2-propanol.

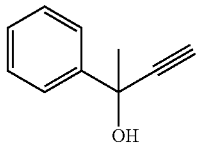

2-Phenyl-but-3-yn-2-ol

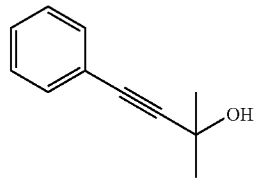

2-Methyl-4-phenyl-but-3-yn-2-ol

Synthesis of BF-Compound 22.

3.81 g (19.4 mmol) 97% 2-chloro-4H-1,2,3-benzodioxaphosphorin-4-one was dissolved in 12 ml THF and added dropwise to a solution of 2.4 g (20 mmol) 2-methylhexane-2-ol and 2.72 ml (20 mmol) triethyl amine in 8 ml THF. The reaction was allowed to continue for 2 hours at room temperature. The formed triethyl amine chlorohydrate is removed by filtration and washed with 8 ml THF. 4 ml triethyl amine and 1.2 ml water was added to the filtrate and the hydrolysis reaction was allowed to continue for 20 hours. The solvent was removed under reduced pressure and the oily residue is redissolved in a solution of 22.3 g (0.23 mol) sodium acetate in 200 ml water. A solution of 5.1 ml bromine in 812 ml water was added to the mixture and the reaction was allowed to continue for 10 minutes. A yellow solid compound precipitates from the mixture and was removed by filtration. The aqueous filtrate is extracted 3 times with tert-butyl methyl ether. The dissolved residues of tert-butyl methyl ether were removed under reduced pressure. 50 ml 2 N NaOH solution was added and the mixture was cooled to 5° C. 5 g (31.6 mmol) $KMnO_4$ dissolved in 400 ml water was added over 45 minutes. The oxidation reaction was allowed to continue for half an hour. 40 ml aceton and 10 ml 2 N NaOH were added and the reaction was allowed to continue for an extra 30 minutes. The precipitated $MnO_2$ was removed by filtration and the pH of the mixture was adjusted to 8.3 with 2 N HCl. 9.52 g (33.4 mmol) barium acetate was added and the mixture was concentrated under reduced pressure to 120 ml. The barium salt precipitated from the medium and was isolated by filtration, washed with water and dried. 3.55 g of the barium salt was isolated. The isolated barium salt was redispersed in 70 ml water and 855 mg (6.46 mmol) ammonium sulfate was added. The mixture was stirred for 24 hours and the precipitated barium sulfate was removed by filtration. The filtrate was evaporated under reduced pressure and the residue was treated with 150 ml methanol. The mixture was stirred for 30 minutes and the precipitated residue was removed by filtration. The filtrate was evaporated under reduced pressure and the residue was treated with a diluted solution of ammonia in methanol. The ammonium salt was isolated by filtration, washed with tert-butyl methyl ether and dried. 1.24 g (28%) of the tertiary phosphate ammonium salt was isolated.

Reaction scheme:

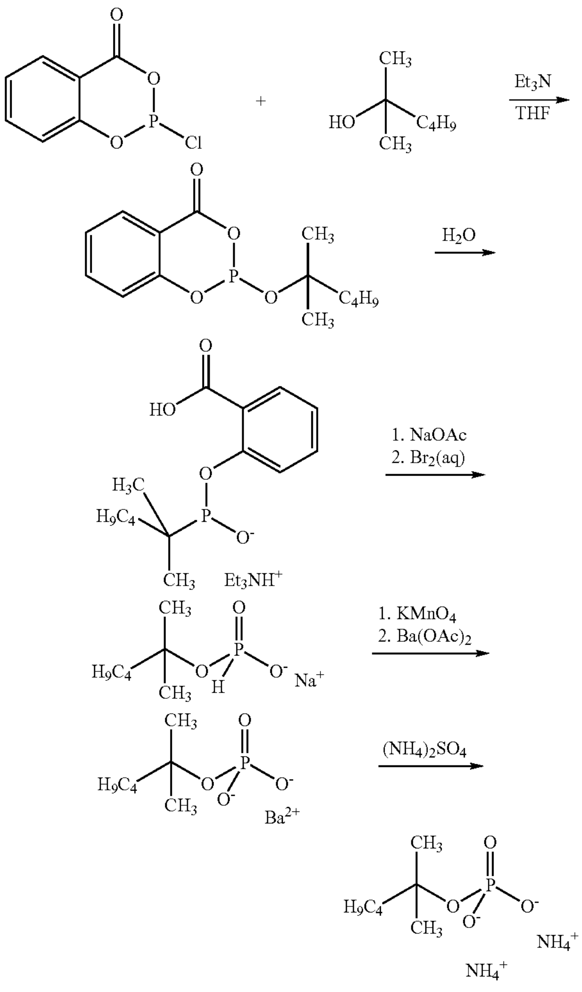

Synthesis of BF-Compound 24.

BF-compound 24 was prepared in the same way as BF-compound 27 (see below) using 3,7,11,15-tetramethyl-hexadec-1-ene-3-ol as tertiary alcohol.

Synthesis of BF-Compound 25.

1.6 g (10 mmol) 3-oxo-butyric acid tert. butyl ester was dissolved in 5 ml THF. 3 g (10 mmol) tris(trimethyl silyl) phosphite was added and the reaction was allowed to continue at room temperature for 24 hours. After 24 hours, 20 ml methanol and 2.8 ml triethyl amine were added, while the temperature was kept below 30° C. The reaction was allowed to continue for 20 hours at room temperature. The reaction mixture was evaporated under reduced pressure and BF-compound 25 was isolated by preparative column chromatography (Varian Mega BE-C18: 15 minutes isocratic elution $MeOH/H_2O$ 1/1 25 ml/min; 15 minutes gradient elution $MeOH/H_2O$ 1/1 to MeOH 25 ml/min). 1.59 g of BF-compound 25 was isolated.

Reaction scheme:

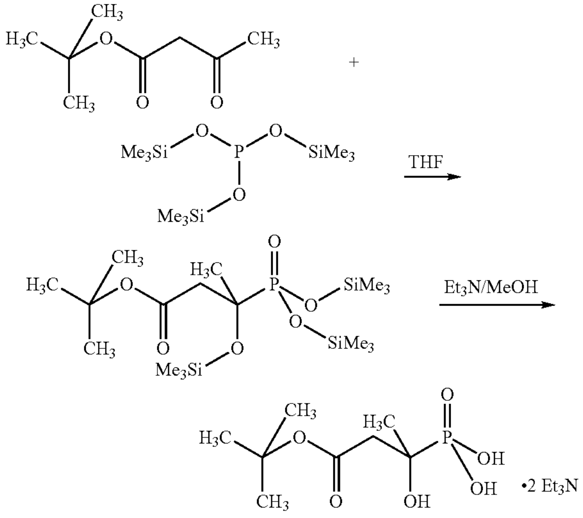

Synthesis of BF-Compound 26.

1.6 g 2-methyl-4-phenyl-3-butyn-2-ol (10 mmol) was dissolved in 10 ml tert.-butyl-methyl-ether. 60 mg dimethylamino pyridine was added and the mixture was cooled to 0° C. 1.2 g (12 mmol) diketene was added over 15 minutes, while the temperature was kept at 0° C. The reaction was allowed to continue for 2 hours at room temperature. Some oily residues were removed by filtration and the solvent was removed under reduced pressure. The intermediate beta keto-ester was isolated by preparative column chromatography (15 min isocratic elution with $CH_2Cl_2$, flow rate 150 ml/min, followed by gradient elution up to $CH_2Cl_2$/ ethyl acetate 90/10 over 29 minutes, flow rate 150 ml/min on a Prochrom LC80, packed with Kromasil Si 60A, 10 μm). 1.44 g (60%) of the intermediate was isolated.

1.3 g (5.3 mmol) of the intermediate was dissolved in 10 ml THF. 2 g (6.8 mmol) tris(trimethylsilyl)phophite was added and the reaction was allowed to continue for 24 hours at room temperature. An additional 2.7 g of tris(trimethylsilyl)phosphite was added and the reaction was allowed to continue for an additional 24 hours at room temperature. After 24 hours, 20 ml methanol and 3.7 ml triethyl amine were added and the reaction was allowed to continue for 24 hours at room temperature. The solvent was removed under reduced pressure and BF-compound 26 was isolated by preparative column chromatography (15 minutes isocratic elution with $H_2O$/ MeOH 50/50 at a flow rate of 25 ml/min followed by gradient elution up to pure methanol over 30 minutes on a Varian Mega BE-C18). 0.315 g of BF-compound 26 was isolated.

Reaction scheme:

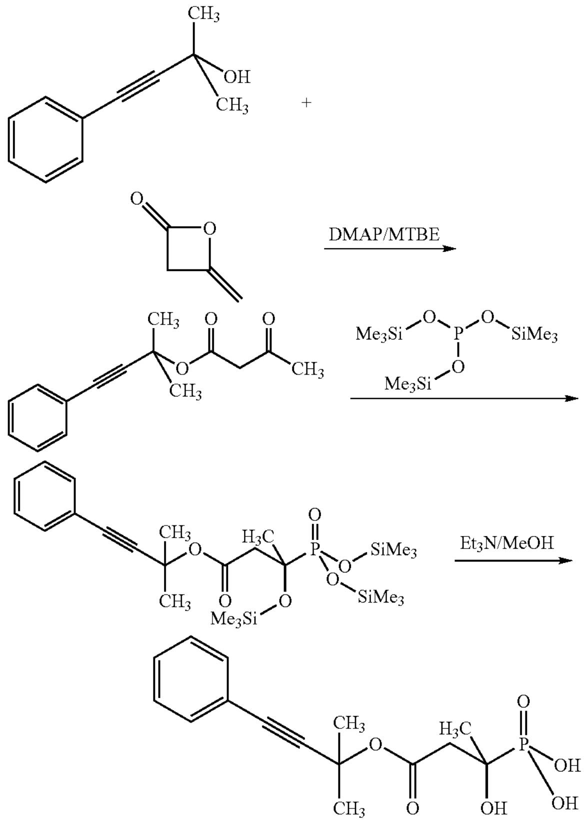

Synthesis of BF-Compound 27.

0.15 g dimethylamino pyridine was added to 5.6 g (25 mmol) nerolidol. The mixture was heated to 50° C. and 2.1 g (25 mmol) diketene was added over 2 hours while keeping the reaction temperature between 48° C. and 56° C. The reaction was allowed to continue for 1 hour at 50° C. An extra 0.2 equivalent diketene was added and the reaction was allowed to continue for an extra hour at 50° C. After 1 hour, an extra 0.8 equivalent diketene was added. After one extra hour at 50° C., the reaction mixture was allowed to cool to room temperature. 100 ml methylene chloride was added to the reaction mixture and the mixture was evaporated under reduced pressure. The intermediate beta-keto-ester was isolated by preparative column chromatography (isocratic elution with $CH_2Cl_2$ at a flow rate of 200 ml/min on a Prochrom LC80, packed with Kromasil Si 60A, 10 μm). 4.5 g of the intermediate was isolated. 1.3 g (4.2 mmol) of the beta-keto-ester was dissolved in 5 ml THF. 1.25 g (4.2 mmol) tris(trimethyl silyl) phosphite was added and the reaction was allowed to continue for 24 hours at room temperature. After 24 hours an extra equivalent tris(trimethyl silyl)phosphite was added and the reaction mixture was heated to 40° C. The reaction mixture was allowed to cool to room temperature and 20 ml methanol and 1.4 ml triethyl amine were added to the reaction mixture. The reaction was allowed to continue for 3 hours at room temperature. The reaction mixture was evaporated under reduced pressure and BF-compound 27 was isolated by preparative column chromatography (15 minutes isocratic elution with $H_2O$/MeOH 50/50 at a flow rate of 25 ml/min followed by gradient elution upto pure methanol over 30 minutes on a Varian Mega BE-C18). 0.44 g of BF-compound 27 was isolated.

Reaction scheme:

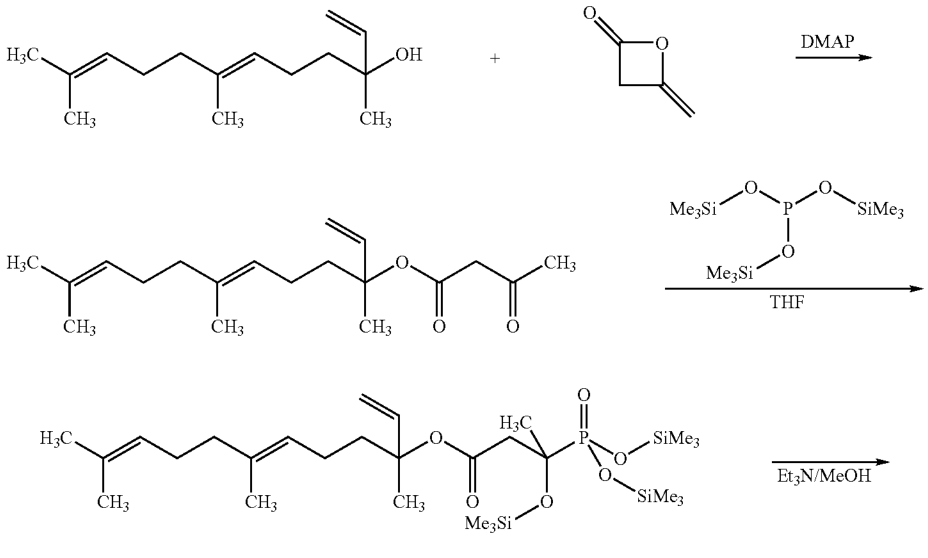

-continued

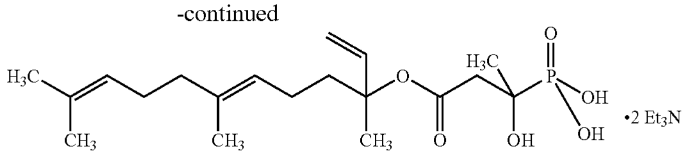

Synthesis of BF-Compound 30.

1.7 g (10 mmol) pinanediol was dissolved in 40 ml methylene chloride. 1.1 g (11 mmol) triethyl amine and 0.3 g (2.4 mmol) dimethylamino pyridine were added. The reaction mixture was cooled to 0° C. and a solution of 3.6 g (11 mmol) of the sulfochloride (the sulfochloride was prepared as described U.S. Pat. No. 3,761,544) was added dropwise. The reaction was refluxed for 15 hours. After cooling down to room temperature, an extra 50 ml methylene chloride was added. The reaction mixture was extracted twice with 50 ml of a saturated $NaHCO_3$-solution, twice with 50 ml brine (saturated NaCl) and twice with 50 ml 0.1 N HCl. The organic fraction was dried over $MgSO_4$ and evaporated under reduced pressure. The phosphonate ester was purified on a Varian Flash column using ethyl acetate as eluent. 2.5 g of the intermediate was isolated.

1.8 g (3.9 mmol) of the phosphonate ester was dissolved in 25 ml methylene chloride. 4.8 g (31 mmol) of TMSBr (trimethylsilyl-Br) was added and the reaction was allowed to continue for two hours at room temperature. The reaction mixture was evaporated under reduced pressure. 25 ml water and 2 ml 1 N HCl was added to the oily residue. The reaction was allowed to continue for 16 hours at room temperature. The reaction mixture was extracted twice with 60 ml ethyl acetate. The pooled organic fractions were dried over $MgSO_4$ and evaporated under reduced pressure. BF-compound 30 was obtained as an oily residue.

Reaction scheme:

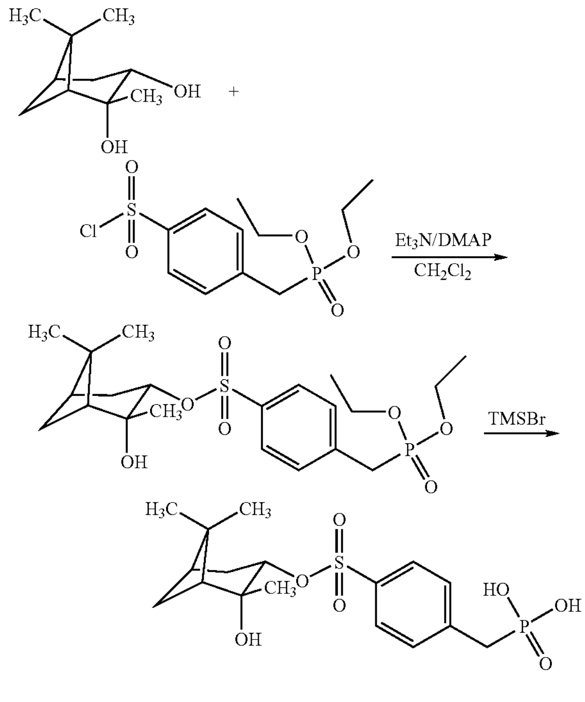

Synthesis of BF-Compound 38.

BF-compound 38 was prepared in the same way as BE-compound 19 (see above) starting from 2-(4-biphenyl)-propan-2-ol.

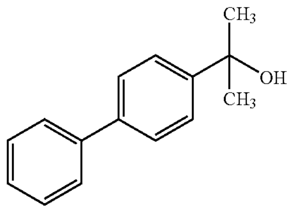

2-(4-biphenyl)-propan-2-ol

Synthesis of BF-Compound 39.

BF-compound 39 was prepared in the same way as BF-compound 19 (see above) starting from 3-methyl-1-nonyn-3-ol.

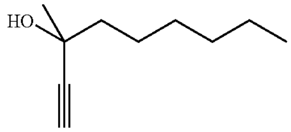

3-methyl-1-nonyn-3-ol

Synthesis of BF-Compound 40.

BF-40 was prepared in a using the synthetic methodology described for BF-19, using 2-(4-chloro-phenyl)-propan-2-ol as tertiary alcohol. This alcohol was prepared as follows.

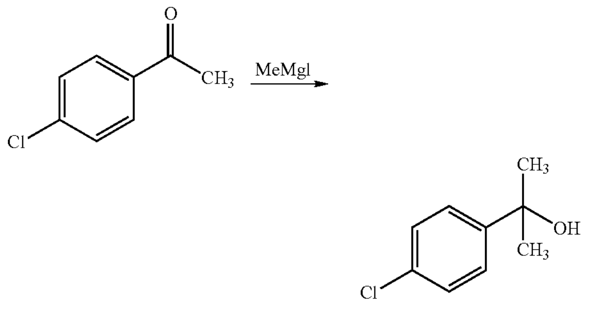

MeMgI was prepared immediately before use by reacting 4.83 g (200 mmol) Mg and 29.2 g (12.8 ml, 206 mmol) methyl iodide in 100 ml diethyl ether. To this solution, a solution of 25.6 g (21.5 ml, 166 mmol) 4-chloro-acetophenone in 30 ml diethyl ether was added over 40 minutes while the temperature was kept at 0° C. The reaction is allowed to continue for one hour at room temperature. The reaction mixture was cooled to 0° C. and 60 ml of a saturated solution of ammonium chloride was added over one hour. The ether fraction was isolated and the ammonium chloride solution was extracted twice with 100 ml diethyl ether. The pooled ether fractions were extracted with 100 ml water and 100 ml brine, dried over $MgSO_4$ and evaporated under reduced pressure. The crude 2-(4-chloro-phenyl)-propan-2-ol was purified by preparative column chromatography on Kieselgel 60 (Aldrich) using cyclohexane/ethylacetate 9/1 as eluent. 20.9 g of the purified alcohol was isolated.

Synthesis of BF-Compound 41.

1 g (7.2 mmol) phosphoric acid mono-(2-amino-ethyl) ester was dissolved in water and 1.6 g (16 mmol) triethyl amine was added. The reaction mixture was cooled to 15° C. and a solution of 1.6 g (7.3 mmol) di-tert.-butyl pyrocarbonate in 12 ml acetone was added dropwise. $CO_2$ gradually evolved. The reaction was allowed to continue over night at room temperature. The acetone was removed under reduced pressure and the residual water was removed using an air flow at 44° C. The residue was dissolved in 30 ml methanol and the methanol was evaporated under reduced pressure. 2.1 g of BF-41 was isolated. $^1$H-NMR spectroscopy showed that the phosphoric acid mono-ester was only partially converted to its tri-ethylamine salt not having two tri-ethylammonium counterions.

Reaction scheme:

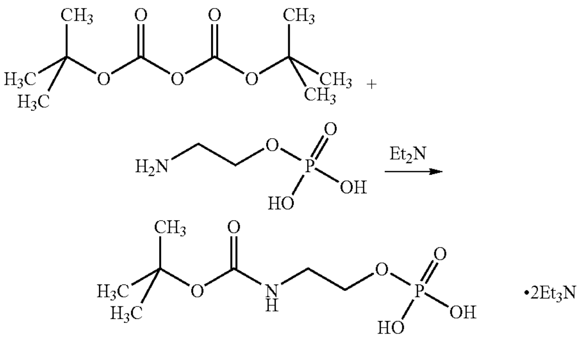

Synthesis of BF-Compound 42.

2.3 g (10 mmol) di-tert.butyl-azodicarboxylate was dissolved in 30 ml methylene chloride. 76 mg (0.5 mmol) 1,8-diazabicyclo [5.4.0] undec-7-ene (DBU) was added. The reaction mixture was cooled to −5° C. and 1 g (10 mmol) 2,4-pentanedione was added drop-wise. The reaction was allowed to continue for 30 minutes at 0° C. and another 2 hours at 15° C. 50 ml methylene chloride was added to the reaction mixture and the mixture was extracted twice with 50 ml water. The methylene chloride was dried over $MgSO_4$ and the solvent was removed under reduced pressure. 3.3 g of BF-compound 42 was isolated as a yellow solid. BF-compound 42 was used for evaluation without further purification.

Reaction scheme:

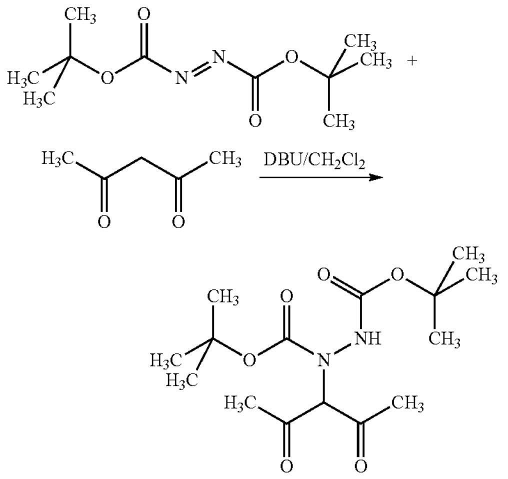

EXAMPLE 1

1.1 Preparation of the Lithographic Support.

A 0.28 mm thick aluminum support was degreased by spraying it with an aqueous solution containing 34 g/l of sodium hydroxide at 70° C. for 5.9 s and rinsing it at room temperature for 3.6 s with a solution containing 12.4 g/l hydrochloric acid and 9 g/l sulphuric acid.

The aluminum support was than electrochemically grained using an alternating current in an aqueous solution containing 12.4 g/l hydrochloric acid and 9 g/l sulphuric acid at a temperature of 37° C. and at a charge density of 54500 Coulomb/$m^2$.

Subsequently, the support was etched with an aqueous solution containing 145 g/l sulphuric acid at 80° C. for 4.8 s and rinsed with water at room temperature for 3.6 s.

After the etching step, the support was subjected for 4.6 s to an anodic oxidation in an aqueous solution containing 145 g/l sulphuric acid and 10 g/l aluminum sulphate at a temperature of 57° C. and a current density of 2500 A/$m^2$. Subsequently, the anodized support was washed with water at room temperature for 3.6 s and then dried at 55° C. for 5.3 s.

1.2 Preparation of the Printing Plates.

Preparation of the Coating Solutions.

The coating solutions (Table 1) were prepared as follows: first the ingredients were dissolved in 50 ml of the solvent indicated in Table 1; subsequently the infrared absorbing agent was added and the solution was diluted with the same solvent to 100 ml.

TABLE 1 composition of the coating solutions.

| Ingredients g/100 ml | Sol. 1 comp. | Sol. 2 comp. | Sol. 3 comp. | Sol. 4 inv. | Sol. 5 inv. | Sol. 6 inv. | Sol. 7 inv. |
|---|---|---|---|---|---|---|---|
| Comparative (1) | 0.5 | 0.2 | 0.04 | — | — | — | — |
| BF-comp. 9 | — | — | — | 2.2 | — | — | — |
| BF-comp. 13 | — | — | — | — | 0.67 | — | — |
| BF-comp. 14 | — | — | — | — | — | 0.67 | 0.67 |

TABLE 1-continued composition of the coating solutions.

| Ingredients g/100 ml | Sol. 1 comp. | Sol. 2 comp. | Sol. 3 comp. | Sol. 4 inv. | Sol. 5 inv. | Sol. 6 inv. | Sol. 7 inv. |
|---|---|---|---|---|---|---|---|
| IR-1 (2) | — | — | — | — | — | 0.33 | — |
| IR-2 (3) | 0.4 | 0.4 | 0.4 | 0.93 | 0.33 | — | 0.33 |
| Water (4) | X | X | X | — | — | — | — |
| Acetone (4) | — | — | — | — | X | — | — |
| Ethanol (4) | — | — | — | — | — | X | X |
| Isopropanol | — | — | — | X | — | — | — |

(1) The comparative compound is commercially available from Aldrich; the compound is not capable of converting from a hydrophobic state to a hydrophilic state or vice versa upon the action of heat and/or in the presence of an acid or a base and is represented by the following chemical structure:

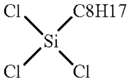

(2) IR-1 is an infrared absorbing agent and is represented by the following chemical formula:

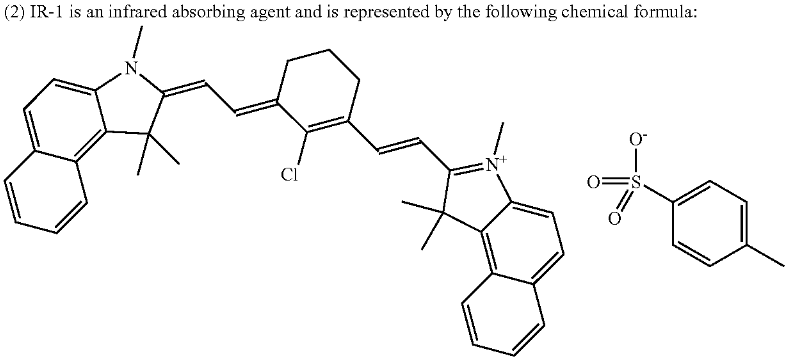

(3) IR-2 is an infrared absorbing agent and is the tri-ethyl ammonium salt of IR-A defined above;
(4) X indicates the solvent used to make the coating solution.

Preparation of the Printing Plates.

The printing plate precursors 1-3 (comparative) and 4-7 (invention) were produced by coating the solutions 1 to 7 as defined in Table 1 onto the above described lithographic support. The coating solutions were applied at a wet coating thickness of 30 μm.

The printing plate precursors were subsequently irradiated with an IR-laser (830 nm) with a pitch of 7 μm at varying energy densities (Table 2).

TABLE 2

Applied energy densities.

| Laser Setting | Power mW | Drumspeed m/s | Energy density mJ/cm$^2$ |
|---|---|---|---|
| 0 | 0 | 0 | 0 |
| 1 | 200 | 8 | 357 |
| 2 | 280 | 8 | 500 |
| 3 | 140 | 4 | 500 |
| 4 | 200 | 4 | 714 |
| 5 | 280 | 4 | 1000 |

1.3 Print Results.

After the exposure step, the printing plates were directly mounted on an ABDick 360 printing press and a print job was started without carrying out any processing or rinsing step. During the printing, Van SON 167 ink (trademark of Van Son) was used and Rotamatic (available from Unigrafica GmbH) as fountain liquid (dampening liquid). A compressible rubber blanket was used and 100 prints were made on 80 g offset paper. The print results are summarized in Table 3.

TABLE 3

Print results.

| Printing plate | MRED (1) mJ/cm$^2$ | Printing quality (2) |
|---|---|---|
| PP 1 (Comp.) | — | 0 |
| PP 2 (Comp.) | — | 0 |
| PP 3 (Comp.) | — | 0 |
| PP 4 (Inv.) | 357 | + |
| PP 5 (Inv.) | 500 | + |
| PP 6 (Inv.) | 714 | ++ |
| PP 7 (Inv.) | 500 | ++ |

(1) The MRED value (Minium Required Energy Density) defines the minimum energy density required to observe an image.
(2) The prints were evaluated as follows:
0 = no image
+ = acceptable image
++ = good
+++ = excellent image All printing plates were ink accepting in the non-exposed areas. This indicates that the bi-functional compound clearly contributes to the ink accepting properties and that the compound is well adhered to the surface of the support.

EXAMPLE 2

2.1 Preparation of the Lithographic Support.

The support was prepared as described in Example 1.

2.2 Preparation of the Printing Plates.

Preparation of the Coating Solutions

The coating solutions (Table 4) were prepared as follows: first the ingredients were dissolved in 50 ml of the solvent indicated in Table 4; subsequently the infrared absorbing agent was added and the solution was diluted with the same solvent to 100 ml. .

TABLE 4

| coating solutions. | | | | | | | | | | |
|---|---|---|---|---|---|---|---|---|---|---|
| Ingredients g/100 ml | Sol. 8 comp. | Sol. 9 comp. | Sol. 10 comp. | Sol. 11 inv. | Sol. 12 inv. | Sol. 13 inv. | Sol. 14 inv. | Sol. 15 inv. | Sol. 16 inv. | Sol. 17 inv. |
| Rhodafac RA-600(1) | 0.25 | — | — | — | — | — | — | — | — | — |
| Emphos PS 810 (2) | — | 0.25 | — | — | — | — | — | — | — | — |
| Rhodafac ASI-80 (3) | — | — | 0.25 | — | — | — | — | — | — | — |
| BF-comp. 25 | — | — | — | 0.25 | 0.67 | 0.67 | — | — | — | — |
| BE-comp. 27 | — | — | — | — | — | — | 0.27 | — | — | — |
| BF-comp. 26 | — | — | — | — | | — | — | 0.25 | 0.67 | — |
| BF-comp. 24 | — | — | — | — | | — | — | — | — | 0.25 |
| IR-2 (4) | 0.25 | 0.25 | 0.25 | 0.25 | 0.33 | 0.33 | 0.27 | 0.23 | 0.33 | 0.23 |
| Water (5) | X | X | X | X | X | — | — | — | — | — |
| Ethanol (5) | — | — | — | — | — | X | X | X | X | X |

(1) Rhodafac RA-600 is a C8-C10 polyoxyethylene ether phosphate (mixture of mono- and diphosphate) commercially available from Rhodia; the compound is not capable of converting from a hydrophobic state to a hydrophilic state or vice versa upon the action of heat and/or in the presence of an acid or a base.
(2) Emphos PS 810 is an alkyl polyglycolether phosphoric acid commercially available from Akzo Nobel, the compound is not capable of converting from a hydrophobic state to a hydrophilic state or vice versa upon the action of heat.
(3) Rhodafac ASI-80 is a phosphonate commercially available from Akzo Nobel; the compound is not capable of converting from a hydrophobic state to a hydrophilic state or vice versa upon the action of heat and is represented by the following chemical structure:

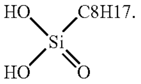

(4) IR-2 is an infrared absorbing agent as defined in Table 1.
(5) X indicates the solvent used to make the coating solution.

Preparation of the Printing Plates.

The printing plate precursors 8-10 (comparative) and 11-17 (invention) were produced by coating the solutions 8 to 17 as defined in Table 4 onto the above described lithographic support. The coating solutions were applied at a wet coating thickness of 30 μm.

The printing plate precursors were subsequently irradiated with an IR-laser (830 nm) with a pitch of 7 μm at varying energy densities (Table 2).

2.3 Print Results.

After the exposure step, the printing plates were directly mounted on an ABDick 36O printing press and a print job was started. During the printing, Van SON 167 ink (trademark of Van Son) was used and Rotamatic (available from Unigrafica GmbH) as fountain liquid (dampening liquid). A compressible rubber blanket was used and 100 prints were made on 80 g offset paper. The print results are summarized in Table 5.

TABLE 5

| Print results. | | |
|---|---|---|
| Printing plate | MRED (1) mJ/cm$^2$ | Printing quality (2) |
| PP 8 (Comp.) | — | 0 |
| PP 9 (Comp.) | — | 0 |
| PP 10 (Comp.) | — | 0 |
| PP 11 (Inv.) | 500 | +++ |
| PP 12 (Inv.) | 500 | +++ |
| PP 13 (Inv.) | 500 | ++ |
| PP 14 (Inv.) | 500 | + |
| PP 15 (Inv.) | 357 | ++ |
| PP 16 (Inv.) | 357 | ++ |
| PP 17 (Inv.) | 500 | ++ |

TABLE 5-continued (1) The MRED value (Minium Required Energy Density) defines the minimum energy density required to observe a positive image.
(2) The prints were evaluated as follows:
0 = no image
\+ = acceptable image
++ = good image
+++ = excellent image The printing plates comprising the bi-functional compounds were ink accepting in the non-exposed areas which indicates a good adsorption of the compounds to the surface of the support. The results in Table 5 show that the printing plates comprising the bi-functional compounds show an acceptable to excellent image.

EXAMPLE 3

3.1. Preparation of the Lithographic Support.

The support was prepared as described in Example 1.

3.2. Preparation of the Printing Plates.

Preparation of the Coating Solutions.

The coating solutions (Table 6) were prepared as follows: first the bi-functional compounds were dissolved in 50 ml of the solvent indicated in Table 6; subsequently the infrared absorbing agent was added and the solution was diluted with the same solvent to 100 ml.

TABLE 6

| coating solutions. | | | | | | | | |
|---|---|---|---|---|---|---|---|---|
| Ingredients g/100 ml | Sol. 18 Inv. | Sol. 19 Inv. | Sol. 20 Inv. | Sol. 21 Inv. | Sol. 22 Inv. | Sol. 23 Inv. | Sol. 24 Inv. | Sol. 25 Inv. |
| BF-comp. 15 | 0.25 | 0.83 | — | — | — | — | — | — |
| BF-comp. 16 | — | | 0.25 | — | — | — | — | — |
| BF-comp. 22 | — | — | — | 0.25 | 0.67 | — | — | — |
| BF-comp. 17 | — | — | — | — | — | 0.25 | 0.25 | 0.67 |
| IR-1 (1) | 0.25 | — | 0.25 | 0.25 | 0.33 | 0.25 | 0.25 | 0.33 |
| IR-2 (1) | — | 0.83 | — | — | — | — | — | — |
| Water (2) | X | | X | X | X | X | — | X |
| Ethanol (2) | — | X | — | — | — | — | X | — |

(1) IR-1 and IR-2 are infrared absorbing agents as defined in Table 1 above.
(2) X indicates the solvent used to make the coating solution.

Preparation of the Printing Plates.

The printing plate precursors 18-25 were produced by coating the solutions 18 to 25 as defined in Table 6 onto the above described lithographic support. The coating solutions were applied at a wet coating thickness of 30 μm.

The printing plate precursors were subsequently irradiated with an IR-laser (830 nm) with a pitch of 7 μm at varying energy densities (Table 2).

3.3 Print Results.

After the exposure step, the printing plates were directly mounted on an ABDick 360 printing press and a print job was started. During the printing, Van SON 167 ink (trademark of Van Son) was used and Rotamatic (available from Unigrafica GmbH) as fountain liquid (dampening liquid). A compressible rubber blanket was used and 100 prints were made on 80 g offset paper. The print results are summarized in Table 7.

TABLE 7

| Print results. | | |
|---|---|---|
| Printing plate | MRED (1) $mJ/cm^2$ | Printing quality (2) |
| PP 18 (Inv.) | 357 | ++ |
| PP 19 (Inv.) | 500 | + |
| PP 20 (Inv.) | 357 | ++ |
| PP 21 (Inv.) | 500 | +++ |
| PP 22 (Inv.) | 500 | ++ |
| PP 23 (Inv.) | 500 | ++ |
| PP 24 (Inv.) | 357 | + |
| PP 25 (Inv.) | 357 | ++ |

(1) The MRED value (Minium Required Energy Density) defines the minimum energy density required to observe an image.
(2) The prints were evaluated as follows:
0 = no image
+ = acceptable image
++ = good image
+++ = excellent image All printing plates were ink accepting in the non-exposed areas which indicates a good adsorption of the bi-functional compound to the substrate. The results in Table 7 show that the printing plates comprising the bi-functional compounds show acceptable to excellent images.

EXAMPLE 4

4.1. Preparation of the Lithographic Support.

The support was prepared as described in Example 1.

4.2. Preparation of the Printing Plates.

Preparation of the Coating Solutions.

The coating solutions (Table 8) were prepared as follows: first the bi-functional compound was dissolved in 50 ml ethanol; subsequently the infrared absorbing agent was added and the solution was diluted with the same solvent to 100 ml.

TABLE 8

| coating solutions. | | | | |
|---|---|---|---|---|
| Ingredients g/100 ml | Sol. 26 Inv. | Sol. 27 Inv. | Sol. 28 Inv. | Sol. 29 Inv. |
| BF-comp. 30 | 0.03 | 0.03 | 0.83 | 1.67 |
| IR-2 (1) | 0.15 | 0.93 | 0.93 | 0.93 |

(1) IR-2 is an infrared absorbing agent as defined in Table 1 above.

Preparation of the Printing Plates.

The printing plate precursors 26-29 were produced by coating the solutions 26 to 29 as defined in Table 8 onto the above described lithographic support. The coating solutions were applied at a wet coating thickness of 30 μm.

The printing plate precursors were subsequently irradiated with an IR-laser (830 nm) with a pitch of 7 μm at varying energy densities (Table 2).

4.3 Print Results.

After the exposure step, the printing plates were directly mounted on an ABDick 360 printing press and a print job was started. During the printing, Van SON 167 ink (trademark of Van Son) was used and Rotamatic (available from Unigrafica GmbH) as fountain liquid (dampening liquid). A compressible rubber blanket was used and 100 prints were made on 80 g offset paper. The print results are summarized in Table 9.

TABLE 9

| Print results. | | |
|---|---|---|
| Printing plate | MRED (1) $mJ/cm^2$ | Printing quality (2) |
| PP 26 (Inv.) | 714 | + |
| PP 27 (Inv.) | 500 | ++ |
| PP 28 (Inv.) | 714 | ++ |
| PP 29 (Inv.) | 714 | + |

(1) The MRED value (Minium Required Energy Density) defines the minimum energy density required to observe an image.
(2) The prints were evaluated as follows:
0 = no image
+ = acceptable image
++ = good image
+++ = excellent image All printing plates were ink accepting in the non-exposed areas which indicates a good adsorption of the bi-functional compound to the surface of the support. The results in Table 9 show that the printing plates comprising the bi-functional compounds show acceptable to good images.

Example 5

5.1. Preparation of the Lithographic Support.

The support was prepared as described in Example 1.

5.2. Preparation of Printing Plate 30.

Preparation of Coating Solution 30.

The coating solution was prepared as follows: first 0.67 g of the bi-functional compound BF-compound 37 was dissolved in 50 ml demineralized water. Subsequently 0.33 g IR-1 (defined in Table 1) was added and the solution was diluted with the same solvent to 100 ml.

Preparation of Printing Plate 30.

The printing plate precursor 30 was produced by coating the solution 30 onto the above described lithographic support. The coating solution was applied at a wet coating thickness of 30 μm.

The printing plate precursor was subsequently irradiated with an IR-laser (830 nm) with a pitch of 7 μm at varying energy densities (Table 2).

5.3 Print Results.

After the exposure step, the printing plate was directly mounted on an ABDick 360 printing press and a print job was started. During the printing, Van SON 167 ink (trademark of Van Son) was used and Rotamatic (available from Unigrafica GmbH) as fountain liquid (dampening liquid). A compressible rubber blanket was used and 100 prints were made on 80 g offset paper. The print results are summarized in Table 10.

TABLE 10

Print results.

| Printing plate | MRED (1) MJ/$cm^2$ | Printing quality (2) |
|---|---|---|
| PP 30 (Inv.) | 500 | ++ |

(1) The MRED value (Minium Required Energy Density) defines the minimum energy density required to observe an image.
(2) The prints were evaluated as follows:
0 = no image
+ = acceptable image
++ = good image
+++ = excellent image The printing plate was ink accepting in the non-exposed areas which indicates a good adsorption of the bi-functional compound to the surface of the support.

Example 6

6.1 Preparation of the Lithographic Support.

The support was prepared as described in Example 1.

6.2 Preparation of the Printing Plates.

Preparation of Coating Solutions.

The coating solution was prepared as follows: first the bi-functional compounds were dissolved in 50 ml of the solvent indicated in Table 11. Subsequently IR-2 (defined in Table 1) was added and the solution was diluted with the same solvent to 100 ml.

TABLE 11 coating solutions.

| Ingredients g/100 ml | Sol. 31 Inv. | Sol. 32 Inv. | Sol. 33 Inv. | Sol. 34 Inv. | Sol. 35 Inv. | Sol. 36 Inv. | Sol. 37 Inv. | Sol. 38 Inv. | Sol. 39 Inv. |
|---|---|---|---|---|---|---|---|---|---|
| BF-comp. 18 | 0.25 | — | — | — | — | — | — | — | — |
| BF-comp. 19 | — | 0.66 | — | — | — | — | — | — | — |
| BF-comp. 20 | — | — | 0.66 | — | — | — | — | — | — |
| BF-comp. 21 | — | — | — | 0.66 | — | — | — | — | — |
| BF-comp. 38 | — | — | — | — | 0.66 | — | — | — | — |
| BF-comp. 39 | — | — | — | — | — | 0.66 | — | — | — |
| BF-comp. 40 | — | — | — | — | — | — | 0.66 | — | — |
| BF-comp. 41 | — | — | — | — | — | — | — | 0.66 | — |
| BF-comp. 42 | — | — | — | — | — | — | — | — | 0.66 |
| IR-2 (1) | 0.23 | 0.33 | 0.33 | 0.33 | 0.33 | 0.33 | 0.33 | 0.33 | 0.33 |
| Water (2) | — | X | X | X | X | X | X | — | — |
| Ethanol (2) | — | — | — | — | — | — | — | X | X |
| n-Butanol (2) | X | — | — | — | — | — | — | — | — |

(1) IR-2 is an infrared absorbing agent as defined in Table 1 above.
(2) X indicates the solvent used to make the coating.

Preparation of the Printing Plates.

The printing plate precursors 31-39 were produced by coating the solutions 31-39 defined in Table 11 onto the above described lithographic support. The coating solutions were applied at a wet coating thickness of 30 μm.

The printing plate precursors were subsequently irradiated with an IR-laser (830 nm) with a pitch of 7 μm at varying energy densities (Table 2).

6.3 Print Results.

After the exposure step, the printing plates were directly mounted on an ABDick 36O printing press and a print job was started without carrying out any processing or rinsing step. During the printing, Van SON 167 ink (trademark of Van Son) was used and Rotamatic (available from Unigrafica GmbH) as fountain liquid (dampening liquid). A compressible rubber blanket was used and 100 prints were made on 80 g offset paper. The print results are summarized in Table 12.

TABLE 12

Print results.

| Printing plate | MRED (1) mJ/$cm^2$ | Printing quality (2) |
|---|---|---|
| PP 31 (Inv.) | 1000 | + |
| PP 32 (Inv.) | 357 | +++ |
| PP 33 (Inv.) | 500 | + |
| PP 34 (Inv.) | 357 | ++ |
| PP 35 (Inv.) | 357 | +++ |
| PP 36 (Inv.) | 357 | + |
| PP 37 (Inv.) | 357 | +++ |
| PP 38 (Inv.) | 500 | + |
| PP 39 (Inv.) | 500 | + |

(1) The MRED value (Minium Required Energy Density) defines the minimum energy density required to observe an image.
(2) The prints were evaluated as follows:
0 = no image
+ = acceptable image
++ = good image
+++ = excellent image The printing plate was ink accepting in the non-exposed areas which indicates a good adsorption of the bi-functional compound to the surface of the support.

Example 7.

7.1 Preparation of the Lithographic Support.

The support was prepared as described in Example 1.

7.2 Preparation of the Printing Plates.

Preparation of Coating Solutions.

The coating solution was prepared as follows: first the bi-functional compound 25 was dissolved in 50 ml of ethanol. Subsequently IR-3 (defined in Table 13) was added and the solution was diluted with the same solvent to 100 ml.

TABLE 13

| coating solutions. | | | |
|---|---|---|---|
| Ingredients g/100 ml | Sol. 40 Inv. | Sol. 41 Inv. | Sol. 42 Inv. |
| BF-comp. 25 | 0.25 | 0.67 | 0.67 |
| IR-3 (1) | 0.33 | 0.17 | 0.33 |

(1) IR-3 is the following infrared absorbing agent:

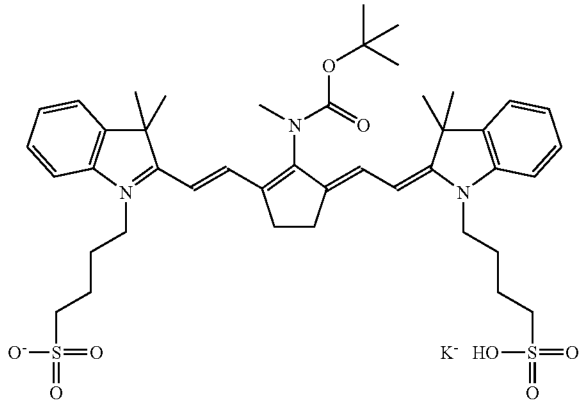

Preparation of the Printing Plates.

The printing plate precursors 40, 41 and 42 were produced by coating the solutions 40, 41 and 42 defined in Table 13 onto the above described lithographic support. The coating solutions were applied at a wet coating thickness of 30 μm.

The printing plate precursors were subsequently irradiated with an IR-laser (830 nm) with a pitch of 7 μm at varying energy densities (Table 2).

Evaluation of the Printing Plates Before Printing.

After exposure and before the print job was started, a negative, colored image was visible on the plates.

7.3 Print Results.

After the exposure step, the printing plates were directly mounted on a GTO-46 printing press commercially available from Heidelberger Druckmaschinen AG and a print job was started without carrying out any processing or rinsing step. During the printing, K+E 800 ink (trademark of BASF Drucksysteme GmbH)) was used and Agfa Prima FS101 (commercially available from Agfa-Gevaert NV) as fountain liquid (dampening liquid). A compressible rubber blanket was used and 100 prints were made on 80 g offset paper. The print results are summarized in Table 14.

TABLE 14

| Print results. | | |
|---|---|---|
| Printing plate | MRED (1) $mJ/cm^2$ | Printing quality (2) |
| PP 40 (Inv.) | 500 | ++ |
| PP 41 (Inv.) | 500 | + |
| PP 42 (Inv.) | 1000 | + |

(1) The MRED value (Minium Required Energy Density) defines the minimum energy density required to observe an image.
(2) The prints were evaluated as follows:
0 = no image
+ = acceptable image
++ = good image
+++ = excellent image The printing plate was ink accepting in the non-exposed areas which indicates a good adsorption of the bi-functional compound to the surface of the support.

The invention claimed is:

1. A heat-sensitive lithographic printing plate precursor comprising on a grained and anodized aluminum support a compound which is capable of converting from a hydrophobic state or vice versa to a hydrophilic state upon exposure to heat and/or in the presence of an acid or a base, and is represented by the following formula:

$$A\text{-}(L)_n\text{-}B$$

wherein

L represents a linking group, n represents 0 or 1;

B represents a thermo-labile group;

and A is selected from the group consisting of a halosilanyl group, an alkoxysilanyl group, a phosphonic acid group or a salt thereof, a phosphoric acid group or a salt thereof, a salicylic acid group or a salt thereof, a boronic acid group or an ester or a salt thereof, an optionally substituted di- or tri-hydroxyaryl group, an optionally substituted salicaldoxime group, an optionally substituted salicaldimine group, an optionally substituted hydroxyheteroaryl group, an amidine group, a 1,3-dicarbonyl group or a group represented by the formula (i)

(i)

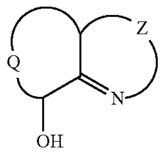

wherein Q and Z independently represent the necessary atoms to form an optionally substituted five or six membered aromatic or heteroaromatic ring;

and group B comprises an optionally substituted alkyl group, an alkyl carboxylate group, an alkoxyalkyl carboxylate group, a benzyl carboxylate group, an oxime carboxylate group, an alkyl carbonate group, an alkoxyalkyl carbonate group, a benzyl carbonate group, an oxime carbonate group, an alkyl carbamate group, an alkoxyalkyl carbamate group, a benzyl carbamate group an oxime carbamate group, —PO—$(OR^a)_2$, —$SO_2$—O—$R^b$, —OPO—$(OR^c)_2$, —$OSO_2$—O—$R^d$, —$SO_2$—$SO_2$—$R^e$, —$SO_2$—$NR^f$—$SO_2$—$R^g$ wherein $R^a$ to $R^g$ each represent an optionally substituted alkyl or aryl group, or $R^a$ to $R^d$ represent a cyclic imide group or $R^f$ represents $—SO_2—R^h$ wherein $R^h$ represents an optionally substituted alkyl or aryl group.

2. A printing plate precursor according to claim 1 further comprising an infrared absorbing agent.

3. A printing plate precursor according to claim 2 wherein the infrared absorbing agent provides a visible image after image-wise exposure.

4. A method for making a lithographic printing plate comprising the steps of:

(i) providing a printing plate precursor according to claim 1;

(ii) image-wise exposing said precursor to heat and/or infrared light whereby the surface of the precursor converts from a hydrophobic state or vice versa to a hydrophilic state at exposed areas.

5. A method of lithographic printing comprising the steps of:

providing a printing plate precursor according to claim 1;

(ii) image-wise exposing said precursor to heat and/or infrared light whereby the surface of the precursor converts from a hydrophobic state or vice versa to a hydrophilic state at exposed areas;

(iii) mounting the exposed precursor on a printing press; and (iv) applying ink and/or dampening liquid onto the exposed precursor.

6. A printing plate precursor according to claim 1, wherein group A of said compound represents a phosphonic acid group or a salt thereof, a phosphoric acid group or a salt thereof, an optionally substituted di- or tri-hydroxyaryl group, an alkoxysilanyl group, or a salicylic acid group and group B of said compound represents an optionally substituted alkyl group, an alkyl carboxylate group, an alkoxyalkyl carboxylate group or a benzyl carboxylate group.

7. A printing plate precursor according to claim 1, wherein L is selected from the group consisting of an optionally substituted alkylene group, an optionally substituted arylene, an optionally substituted heterearylene, —SO—, $—SO_2—$, —CH═N—, —NH—NH—, $—O—(CH_2)_k—$, $—(CH_2)_k—O—$, $—(CH_2)_k—O—CO—(CH_2)_l$, $—(CH_2)_k—COO—(CH_2)_l—$, $—(CH_2)_k—NH—$, $—NH—(CH_2)_k—$, $—(CH_2)_k—CONH—$, $—(CH_2)_k—NHCO—$, $—(CH_2)_k—CONH—SO_2—$, $—NH—(CH_2)_k—O—(CH_2)_l—$, $—CO—(CH_2)_k—$, $—(CH_2)_k—CO—$, —NH—CO—O—, —O—CO—NH—, $—NH—CO—(CH_2)_k—$, —NH—CO—NH—, —NH—CS—NH—, and any combination thereof; and wherein k and l independently represent 0 or an integer equal to or greater than 1.

* * * * *